(12) United States Patent
Kasai et al.

(10) Patent No.: US 9,613,832 B2
(45) Date of Patent: Apr. 4, 2017

(54) MOLD RELEASE FILM AND PROCESS FOR PRODUCING SEMICONDUCTOR PACKAGE

(71) Applicant: Asahi Glass Company, Limited, Chiyoda-ku (JP)

(72) Inventors: Wataru Kasai, Chiyoda-ku (JP); Masami Suzuki, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 15/061,094

(22) Filed: Mar. 4, 2016

(65) Prior Publication Data

US 2016/0189986 A1      Jun. 30, 2016

Related U.S. Application Data

(63) Continuation of application No. PCT/JP2014/079592, filed on Nov. 7, 2014.

(30) Foreign Application Priority Data

Nov. 7, 2013 (JP) .................... 2013-231366
Nov. 7, 2013 (JP) .................... 2013-231367

(51) Int. Cl.
*H01L 21/56*     (2006.01)
*B29C 33/68*     (2006.01)
(Continued)

(52) U.S. Cl.
CPC ............ *H01L 21/566* (2013.01); *B29C 33/68* (2013.01); *B29C 43/18* (2013.01); *B32B 3/28* (2013.01);
(Continued)

(58) Field of Classification Search
CPC ...... H01L 21/566; H01L 24/97; H01L 21/565
See application file for complete search history.

(56) References Cited

U.S. PATENT DOCUMENTS

2011/0254201 A1   10/2011   Higuchi et al.
2012/0148820 A1   6/2012    Okuya
2014/0001661 A1   1/2014    Higuchi et al.

FOREIGN PATENT DOCUMENTS

JP      10-167773      6/1998
JP      10-204189      8/1998
(Continued)

OTHER PUBLICATIONS

International Search report issued Jan. 13, 2015 in PCT/JP2014/079592, filed on Nov. 7, 2014.

*Primary Examiner* — Amar Movva
(74) *Attorney, Agent, or Firm* — Oblon, McClelland, Maier & Neustadt, L.L.P.

(57) ABSTRACT

A mold release film to be disposed on a cavity surface of a mold in a method for producing a semiconductor package wherein a semiconductor element is disposed in the mold and encapsulated with a curable resin to form a resin-encapsulation portion, characterized in that it has a first surface to be in contact with the curable resin at the time of forming the resin-encapsulation portion, and a second surface to be in contact with the cavity surface, at least one of the first surface and the second surface has irregularities formed thereon, and the surface having irregularities formed thereon, has an arithmetic mean roughness (Ra) of from 1.3 to 2.5 μm and a peak count (RPc) of from 80 to 200; and a process for producing a semiconductor package by using the mold release film.

13 Claims, 5 Drawing Sheets

(51) Int. Cl.
    *B29C 43/18*     (2006.01)
    *H01L 23/00*     (2006.01)
    *B32B 7/06*     (2006.01)
    *B32B 27/32*     (2006.01)
    *B32B 3/28*     (2006.01)
    *B29L 31/34*     (2006.01)

(52) U.S. Cl.
    CPC .............. *B32B 7/06* (2013.01); *B32B 27/322* (2013.01); *H01L 21/565* (2013.01); *H01L 24/97* (2013.01); *B29L 2031/3406* (2013.01); *B32B 2307/748* (2013.01); *B32B 2439/00* (2013.01); *H01L 2224/48091* (2013.01); *H01L 2224/73265* (2013.01); *H01L 2924/181* (2013.01)

(56) References Cited

FOREIGN PATENT DOCUMENTS

| | | |
|---|---|---|
| JP | 2002110722 A | 4/2002 |
| JP | 2002-359259 | 12/2002 |
| JP | 2004-58469 | 2/2004 |
| JP | 2006-237187 | 9/2006 |
| JP | 3970464 | 9/2007 |
| JP | 2012-20429 | 2/2012 |
| JP | 2012-125934 | 7/2012 |
| WO | WO 2008/020543 A1 | 2/2008 |

(a)

(b)

(c)

MOLD RELEASE FILM AND PROCESS FOR PRODUCING SEMICONDUCTOR PACKAGE

TECHNICAL FIELD

The present invention relates to a mold release film to be disposed on a cavity surface of a mold in a method for producing a semiconductor package wherein a semiconductor element is disposed in a mold and encapsulated with a curable resin to form a resin-encapsulation portion, and a process for producing a semiconductor package by using the mold release film.

BACKGROUND ART

A semiconductor package has a resin-encapsulation portion to protect a semiconductor element. For formation of the resin-encapsulation portion (for encapsulation of a semiconductor element), a curable resin e.g. a thermosetting resin such as an epoxy resin is used.

As a method for producing a semiconductor package, for example, a method comprising an encapsulating step by a so-called compression molding method or transfer molding method is known, wherein a substrate having a semiconductor element mounted thereon, is disposed so that the semiconductor element is located at a predetermined position in the cavity of a mold, and a curable resin is filled in the cavity to form a resin-encapsulation portion. In such a method, in order to prevent adhesion of the resin-encapsulation portion and the mold, usually, a mold release film is disposed on the cavity surface of the mold.

As one of processes for producing semiconductor packages, there is a process which comprises a step (collectively encapsulating step) of mounting a plurality of semiconductor elements on a substrate, and collectively encapsulating such semiconductor elements with a curable resin, to obtain a collectively encapsulated product comprising the substrate, the plurality of semiconductor elements and a resin encapsulation portion, and a step (singulation step) of cutting and singulating the resin-encapsulation portion and the substrate of the collectively encapsulated product, so that the plurality of semiconductor elements are separated, to obtain a plurality of semiconductor packages (e.g. Patent Document 1). This process is excellent in productivity and therefore is widely used.

In the step of encapsulating the semiconductor elements, a mold release film may sometimes be disposed on the cavity surface of the mold in order to prevent adhesion of the curable resin and the mold. Especially in a case where a plurality of semiconductor elements are collectively encapsulated, as compared with the case of encapsulating one semiconductor element in one cavity, the cavity tends to be large-sized and complicated so that the resin-encapsulation portion tends to be hardly releasable, and therefore, a mold release film is used in many cases.

At the time of encapsulation, the mold release film is stretched along the cavity surface of the mold by vacuum suction and brought in such a state as closely in contact with the cavity surface. At that time, however, if the mold release film is brought in contact with the cavity surface in such a state that air is not yet completely evacuated during stretching, air spaces may partly be formed between the mold release film and the cavity surfaces, and wrinkles are likely to be formed in the mold release film at such portions. If the mold release film has wrinkles, the shape of such wrinkles on the mold release film is likely to be transferred to the surface of the resin-encapsulation portion, thus leading to poor appearance, whereby the yield will be lowered.

In order to overcome such a problem, it has been proposed to adjust the surface roughness Rz on at least one side of the mold release film to be at least 3.0 μm (Patent Document 2). It is disclosed that by mounting the mold release film on the mold so that the surface having a surface roughness Rz of at least 3.0 μm will be in contact with the mold side, it is possible to prevent formation of wrinkles.

Further, in the production of a semiconductor package, it is common to form an ink layer on the surface of the formed resin-encapsulation portion by printing with an ink, in order to display information such as the product number, manufacturers, etc.

If the adhesion between the resin-encapsulation portion and the ink layer is low, the ink layer tends to peel from the resin-encapsulation portion as the time passes.

In order to improve the adhesion between the resin-encapsulation portion and the ink layer, it has been proposed to use a mold release film having irregularities formed on the surface to be in contact with the resin thereby to increase the surface roughness, and to form a resin-encapsulation portion by disposing the mold release film on the mold so that the irregularities face the curable resin side (e.g. Patent Document 3). In this case, the irregularities on the surface of the mold release film in contact with the resin are transferred to the surface of the resin-encapsulation portion. By the presence of such irregularities, the adhesion of the ink layer to the resin-encapsulation portion is improved.

PRIOR ART DOCUMENTS

Patent Documents

Patent Document 1: JP-A-2006-237187
Patent Document 2: JP-A-2002-359259
Patent Document 3: Japanese Patent No. 3,970,464

DISCLOSURE OF INVENTION

Technical Problem

In recent years, large packages, such as wafer-level packages, are increasing, and the contact area of the mold and the mold release film, is increasing. Accordingly, wrinkles are likely to be formed when the mold release film is brought in close contact with the cavity surface of the mold.

If the surface roughness of the surface of the mold release film to be in contact with the mold cavity surface is made to be large, wrinkles are considered to be less likely to be formed. However, according to a study by the present inventors, if the surface roughness of the surface to be in contact with the mold cavity surface, is simply increased, there is such a problem that pinholes tend to be formed in the mold release film. For example, in the case of a cavity having corners, the mold release film is stretched greatly at the corner portions, and pinholes are likely to be formed. When pinholes are formed in the mold release film, the curable resin is likely to leak from such portions and adhere to the cavity surface of the mold. The curable resin adhered to the mold, will then cause poor appearance of the resin-encapsulation portion at the time of encapsulating another semiconductor element. In order to prevent this, washing of the mold, etc. become necessary, whereby the productivity of the semiconductor package will be reduced.

By increasing the thickness of the mold release film as well as increasing the surface roughness of the surface to be in contact with the mold cavity surface, it is considered possible to prevent formation of both wrinkles and pinholes. However, if the thickness of the mold release film becomes thicker, the followability to the shape of the mold cavity will be reduced. If the followability is low, the shape of the cavity will not be accurately reflected in the resin-encapsulation portion, thus leading to a defective product, whereby the yield will be reduced. Further, the raw material cost increases, such being economically undesirable.

In the case of forming an ink layer on the surface of the resin-encapsulation portion, if a mold release film having its surface roughness increased by forming irregularities on the surface to be in contact with the resin, is used, the adhesion of the ink layer to the resin-encapsulation portion is considered to be improved as the surface roughness becomes greater.

However, according to a study by the present inventors, it has been found that in the case of producing a semiconductor package via the collectively encapsulating step and the singulation step, if a mold release film having irregularities formed on the surface to be in contact with the resin, is used, chipping or cracking of the resin-encapsulation portion is likely to be formed at the time of cutting the resin-encapsulation portion and the substrate in the singulation process, as compared with the case of using a mold release film having a smooth surface. As the surface roughness of the mold release film is made larger in order to improve the adhesion of the ink layer to the resin-encapsulation portion, chipping or cracking of the resin-encapsulation portion becomes remarkable.

It is an object of the present invention to provide a mold release film which, even if its thickness is thin, is less likely to have wrinkles or pinholes formed when it is brought in close contact with the cavity surface of the mold, and a process for producing a semiconductor package by using such a mold release film.

It is another object of the present invention to provide a mold release film capable of forming a resin-encapsulation portion which is less susceptible to chipping or cracking in the singulation step and which is excellent in adhesion to an ink layer, in the case of forming an ink layer on the surface of the resin-encapsulation portion, and a process for producing a semiconductor package by using such a mold release film.

Solution to Problem

The present invention provides a mold release film and a process for producing a semiconductor package, having the following constructions [1] to [13].

[1] A mold release film to be disposed on a cavity surface of a mold in a method for producing a semiconductor package wherein a semiconductor element is disposed in the mold and encapsulated with a curable resin to form a resin-encapsulation portion, characterized in that it has a first surface to be in contact with the curable resin at the time of forming the resin-encapsulation portion, and a second surface to be in contact with the cavity surface, at least one of the first surface and the second surface has irregularities formed thereon, and the surface having irregularities formed thereon, has an arithmetic mean roughness (Ra) of from 1.3 to 2.5 μm and a peak count (RPc) of from 80 to 200.

[2] The mold release film according to [1], wherein the thickness of the mold release film is from 16 to 75 μm.

[3] The mold release film according to [1], wherein the second surface has irregularities formed thereon, and the thickness of the mold release film is from 40 to 75 μm.

[4] The mold release film according to any one of [1] to [3], wherein the arithmetic mean roughness (Ra) is from 1.6 to 1.9 μm.

[5] The mold release film according to any one of [1] to [4], wherein the peak count (RPc) of from 100 to 130.

[6] The mold release film according to any one of [1] to [5], which is made of a fluororesin.

[7] The mold release film according to [6], wherein the fluororesin is an ethylene/tetrafluoroethylene copolymer.

[8] The mold release film according to [7], wherein the ethylene/tetrafluoroethylene copolymer comprises units based on tetrafluoroethylene, units based on ethylene, and units based on a third monomer other than tetrafluoroethylene and ethylene, and the molar ratio (TFE/E) of the units based on tetrafluoroethylene to the units based on ethylene in the ethylene/tetrafluoroethylene copolymer is from 80/20 to 40/60.

[9] The mold release film according to [8], wherein the proportion of the units based on the third monomer is from 0.01 to 20 mol % to the total of all units in the ethylene/tetrafluoroethylene copolymer.

[10] The mold release film according to [9], wherein the third monomer is (perfluorobutyl)ethylene, and the proportion of units based on the (perfluorobutyl)ethylene is from 0.5 to 4.0 mol % to the total of all units in the ethylene/tetrafluoroethylene copolymer.

[11] The mold release film according to any one of [7] to [10], wherein MFR as measured in accordance with ASTM D3159, of the ethylene/tetrafluoroethylene copolymer, is from 2 to 40 g/10 min.

[12] A process for producing a semiconductor package formed of a semiconductor element and a curable resin and having a resin-encapsulation portion for encapsulating the semiconductor element, which comprises a step of disposing the mold release film as defined in any one of [1] to [11] and having the irregularities formed at least on the second surface, on a cavity surface of a mold to be in contact with the curable resin, so that the first surface faces the space in the cavity, a step of disposing a substrate having a semiconductor element mounted thereon, in the cavity, encapsulating the semiconductor element with the curable resin, and curing the curable resin in such a state that it is in contact with the mold release film, to form a resin-encapsulation portion, thereby to obtain an encapsulated product comprising the substrate, the semiconductor element mounted on the substrate and the resin-encapsulation portion for encapsulating the semiconductor element, and a step of releasing the encapsulated product from the mold.

[13] A process for producing a semiconductor package formed of a semiconductor element and a curable resin and having a resin-encapsulation portion for encapsulating the semiconductor element, and an ink layer formed on the surface of the resin-encapsulation portion, which comprises a step of disposing the mold release film as defined in any one of [1] to [11] and having the irregularities at least on the first surface, on a cavity surface of a mold to be in contact with the curable resin, so that the first surface faces the space in the cavity, a step of disposing a substrate having a plurality of semiconductor elements mounted thereon, in the cavity, encapsulating the plurality of semiconductor elements collectively with the curable resin, and curing the curable resin in such a state that it is in contact with the mold release film, to form a resin-encapsulation portion, thereby to obtain a collectively encapsulated product comprising the substrate, the plurality of semiconductor elements mounted on the substrate and the resin-encapsulation portion for collectively encapsulating the plurality of semiconductor elements, a step of cutting the substrate and the resin-encapsulation portion of the collectively encapsulated product so that the plurality of semiconductor elements are separated, to obtain singulated encapsulated products each having a substrate, at least one semiconductor element mounted on the substrate, and a resin-encapsulation portion for encapsulating the semiconductor element, and a step of forming an ink layer by using an ink, on the surface which was in contact with the mold release film, of the resin-encapsulation portion of the collectively encapsulated product or the singulated encapsulated product.

Advantageous Effects of Invention

The mold release film of the present invention is unlikely to have wrinkles or pinholes formed when the mold release film is brought in close contact with the cavity surface of the mold in the encapsulation step of forming a resin-encapsulation portion by encapsulating a semiconductor element with a curable resin. Further, when the thickness is made to be from 40 to 75 µm, it is particularly excellent in the followability to the mold. Therefore, according to the mold release film of the present invention, poor appearance of the resin-encapsulation portion or adhesion of the curable resin to the mold in the encapsulation step is unlikely to occur, and it is possible to improve the productivity of the semiconductor package.

In the process for producing a semiconductor package of the present invention, in the encapsulation step of forming the resin-encapsulation portion by encapsulating a semiconductor element with a curable resin, wrinkles or pinholes are unlikely to be formed when the mold release film is brought in close contact with the cavity surface of the mold. Further, when the thickness of the mold release film is made to be from 40 to 75 µm, the followability to the mold will be especially excellent. Therefore, poor appearance of the resin-encapsulation portion or adhesion of the curable resin to the mold in the encapsulation step is unlikely to occur. Thus, according to the process for producing a semiconductor package of the present invention, it is possible to produce a semiconductor package with good productivity.

Further, at the time of forming an ink layer by printing with an ink on the surface of the resin-encapsulation portion, chipping or cracking is unlikely to occur in the singulation step, and it is possible to form a resin-encapsulation portion excellent in adhesion to the ink layer.

Further, in the process for producing a semiconductor package of the present invention, it is possible to prevent chipping or cracking of the resin-encapsulation portion in the singulation step. Also, it is possible to form an ink layer with good adhesion on the resin-encapsulation portion. Thus, according to the process for producing a semiconductor package of the present invention, it is possible to produce a semiconductor package having no chipping or cracking in the resin-encapsulation portion, whereby the ink layer is unlikely to be peeled.

DESCRIPTION OF EMBODIMENTS

Figure 1:
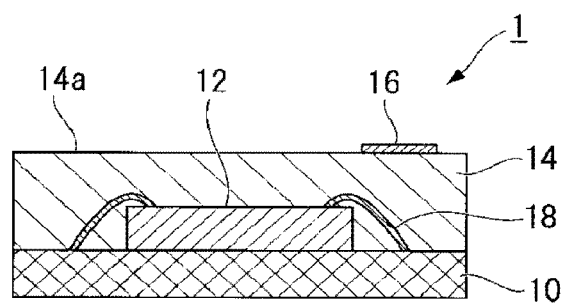
FIG. 1 is a schematic cross-sectional view showing an example of a semiconductor package to be produced by the process for producing a semiconductor package of the present invention.

In this specification, a "mold release film" is a mold release film to be disposed on a cavity surface of a mold in a method for producing a semiconductor package wherein a semiconductor element is disposed in the mold and encapsulated with a curable resin to form a resin-encapsulation portion. For example, at the time of forming a resin-encapsulation portion of a semiconductor package, it is a film to be disposed so as to cover a cavity surface of a mold that has the cavity of a shape corresponding to the shape of the resin-encapsulation portion, and as it is positioned between the formed resin-encapsulation portion and the cavity surface, it enhances the releasability of the obtained semiconductor package from the mold.

In a resin, "units" means structural units (monomer units) that constitute the resin.

A "fluororesin" means a resin containing fluorine atoms in its structure.

In this specification, an "arithmetic mean roughness (Ra)" is an arithmetic mean roughness to be measured in accordance with JIS B0601: 2013 (ISO4287: 1997, Amd. 1: 2009). In determining Ra, the standard length lr (cut-off value λc) for roughness curve was set to be 0.8 mm.

In this specification, a "peak count (RPc)" is the number of peaks counted based on the roughness curve as measured in accordance with JIS B0601: 2013 (ISO4287: 1997, Amd. 1: 2009) and is defined by the following formula (I).

$$RPc = L/RSm \qquad (I)$$

In the formula (I), L represents an standard length and is 10 mm.

RSm represents an average length of roughness curve elements and is measured in accordance with JIS B0601: 2013 (ISO4287: 1997, Amd. 1: 2009).

The thickness of the mold release film in this specification is a value as measured in accordance with ISO4591: 1992 (JIS K7130:1999 B1 method, a method of measuring the thickness by a mass method, of a sample taken from a plastic film or sheet).

The tensile modulus at 180° C. of the release film is measured by a method in accordance with JIS K7127: 1999 (ISO 527-3 1995). Specifically, it is measured by conducting a tensile test under conditions of a sheet temperature of 180° C. and a tensile rate of 1 mm/min with respect to a test sheet obtained by cutting the mold release film into a strip shape (test piece type 5).

[Mold Release Film]

The mold release film of the present invention is a mold release film to be disposed on a cavity surface of a mold for forming a resin-encapsulation portion by encapsulating a semiconductor element with a curable resin, and it has a first surface to be in contact with the curable resin at the time of forming the resin-encapsulation portion, and a second surface to be in contact with the cavity surface.

That is, the mold release film of the present invention is disposed so that the first surface faces the space in the mold cavity and will be in contact with the curable resin at the time of forming the resin-encapsulation portion. Further, at that time, the second surface will be in close contact with the cavity surface of the mold. Therefore, by curing the curable resin in this state, the resin-encapsulation portion having a shape corresponding to the shape of the mold cavity will be formed.

(Surface Having Specific Irregularities Formed Thereon)

Specific irregularities are formed on at least one of the first surface and the second surface of the mold release film of the present invention. The surface having specific irregularities formed thereon is meant for a surface having a Ra of from 1.3 to 2.5 µm and a RPc of from 80 to 200.

The shape of the surface having specific irregularities formed thereon may be a shape in which a plurality of convexes and/or concaves are randomly distributed, or may be a shape in which a plurality of convexes and/or concaves are regularly arranged. Further, the shapes and sizes of the plurality of convexes and/or concaves may be the same or different.

The convexes may be elongated ridges extending on the surface of the mold release film, or protrusions or the like scattered on the surface of the mold release film. Otherwise, in a case where concaves are formed on a flat plane, the convexes may be portions where no concaves are formed.

The concaves may be elongated grooves extending on the surface of the mold release film, or holes or the like scattered on the surface of the mold release film. Otherwise, in a case where convexes are formed on a flat plane, the concaves may be portions where no convexes are formed.

The shape of ridges or grooves may be a straight line, curved line or bent line shape. On the surface having specific irregularities formed thereon, a plurality of ridges or grooves may be present in parallel or in stripes. Of ridges or grooves, the cross-sectional shape in a direction perpendicular to the longitudinal direction may be polygonal such as triangular (V-shape), semi-circular or the like.

The shape of the protrusions or holes may be polygonal, such as triangular pyramid, square pyramid or hexagonal pyramid, conical, hemispherical, polyhedral, other various irregular shapes or the like.

The surface having specific irregularities formed thereon of the mold release film of the present invention has a Ra of from 1.3 to 2.5 µm and a RPc of from 80 to 200. Ra is preferably from 1.5 to 2.1 µm, particularly preferably from 1.6 to 1.9 µm. RPc is preferably from 90 to 150, particularly preferably from 100 to 130.

In a case where the second surface is a surface having specific irregularities formed thereon, i.e. a surface to be in contact with the cavity surface, when Ra is at least 1.3 µm and RPc is at least 80, the mold release film tends to well slip over the cavity surface of the mold at the time of letting the mold release film to follow and be adsorbed on the cavity surface of the mold, and wrinkles are unlikely to be formed. If Ra is less than 1.3 µm or RPc is less than 80, i.e. if the size of irregularities is too small or if the number of irregularities that exist within a certain distance is too small, the mold release film is likely to have wrinkles.

When Ra is at most 2.5 µm and RPc is at most 200, the mold release film is unlikely to have pinholes at the time of letting the mold release film follow the mold, and leakage of the curable resin is less likely to occur. If Ra exceeds 2.5 µm or RPc exceed 200, i.e. if the size of irregularities is too large or if the number of irregularities that exist within a certain distance is too large, pinholes are likely to be formed in the mold release film.

In a case where a surface having specific irregularities formed thereon is the first surface, i.e. the surface to be in contact with the curable resin, when Ra is at most 2.5 µm and RPc is at most 200, it is possible to prevent chipping or cracking at the time of singulating the resin-encapsulation portion (singulation). If Ra exceeds 2.5 µm or RPc exceeds 200, i.e. if the size of irregularities is too large or if the number of irregularities that exist within a certain distance is too large, chipping or cracking is likely to occur.

When Ra is at least 1.3 µm and RPc is at least 80, the adhesion between the surface of the resin-encapsulation portion to be formed by using the mold release film and the ink layer to be formed on the surface will be improved. If Ra is less than 1.3 µm or RPc is less than 80, i.e. if the size of irregularities is too small or if the number of irregularities that exist within a certain distance is too small, adhesion of the ink layer is likely to be insufficient.

Further, in a case where a surface having specific irregularities formed thereon is the first surface, when Ra is at least 1.3 µm and RPc is at least 80, the peeling electrification can be prevented. In the production of semiconductor packages, the mold release film is often used by feeding it from a roll, and at that time, the mold release film is likely to be electrified. Especially when the mold release film is a fluororesin, such electrification is likely to occur. If the mold release film is electrified, foreign matters are likely to adhere to the mold release film. If foreign matters adhere to the mold release film, the shape of the foreign matters is likely to be transferred to the surface of the resin-encapsulation portion, and the appearance is likely to be deteriorated. When the surface of the mold release film has irregularities with Ra being at least 1.3 µm and RPc being at least 80, at the time of peeling the mold release film and the resin-encapsulation portion (a cured product of the curable resin) after the encapsulation step, the apparent contact area between the mold release film and the resin-encapsulation portion decreases, whereby the peeling electrification can be decreased. That is, it is possible to reduce a damage to the semiconductor element due to to the electrification at the time of peeling the mold release film. This effect is particularly remarkable when an epoxy resin having a large molding shrinkage is used as the curable resin.

In the mold release film of the present invention, both the first and second surfaces may be surfaces having the specific irregularities formed thereon. In such a case, each surface has the aforementioned advantageous effects, and even in a case of not forming an ink layer on the surface of the resin-encapsulation portion, peeling electrification is suppressed, and thus, the mold release film will be less likely to have wrinkles or pinholes.

In the mold release film of the present invention, more preferably, one of the first surface and the second surface is a surface having the specific irregularities formed thereon, and the other surface is a surface having irregularities other than the specific irregularities formed thereon or a smooth surface. The other surface is preferably a substantially smooth surface as compared to the surface having the specific irregularities formed thereon.

The substantially smooth surface is preferably a surface with Ra being from 0.01 to 0.5 μm. More preferably, Ra is from 0.05 to 0.3 μm. Further, RPc of the surface is preferably at most 80, more preferably from 10 to 60.

(Thickness)

The thickness of the mold release film of the present invention is preferably from 16 to 75 μm, and, in a case where it has the specific irregularities only on the first surface, the thickness is particularly preferably from 25 to 50 μm. Further, in a case where it has the specific irregularities only on the second surface, the thickness is more preferably from 40 to 75 μm, further preferably from 45 to 70 μm, particularly preferably from 50 to 60 μm. When the thickness is at least the lower limit value in the above range, handling of the mold release film will be easy, and wrinkles are less likely to occur when the mold release film is disposed over the mold cavity while pulling the mold release film. When the thickness is at most the upper limit value in the above range, the mold release film can be easily deformed, whereby the followability to the shape of the mold cavity will be improved and the mold release film can be made to be in close contact with the cavity surface, and thus, it is possible to form a resin-encapsulation portion of high quality constantly.

The thickness of the mold release film of the present invention is preferably thinner within the above range, as the mold cavity becomes larger. Further, it is preferably thinner within the above range, as the mold becomes more complex as having a large number of cavities.

(Physical Properties of Mold Release Film)

Tensile Modulus of Elasticity:

The tensile modulus of elasticity of the mold release film of the present invention at 180° C. i.e. at the temperature of the mold in normal molding, is preferably from 10 to 100 MPa, particularly preferably from 25 to 50 MPa.

When the tensile modulus of elasticity at 180° C. is at most the upper limit value in the above range, at the time of encapsulating a semiconductor element, the mold release film will completely follow the mold, and the mold shape will be transferred fully to the corner of the resin-encapsulation portion. As a result, it is possible to use a collectively encapsulated package to the end, and it is thus possible to improve the yield. If the tensile modulus of elasticity exceeds 100 MPa, at the time of letting the mold release film to follow the mold by vacuuming, the followability of the mold release film to the mold will be poor, whereby in transfer molding, a semiconductor chip is likely to be broken by contact with the film which fails to fully follow during clamping. In compression molding, for similarly poor followability to the mold, there is a possibility that when a curable resin is fed on the film, it may overflow from the mold.

When the tensile modulus of elasticity at 180° C. is at least the lower limit value in the above range, at the time of disposing the mold release film over the mold cavity while pulling the mold release film, the mold release film is not too soft, and the tension will be uniformly exerted on the mold release film, whereby wrinkles are unlikely to be formed. As a result, it is possible to prevent poor appearance of the surface of the resin-encapsulation portion due to the transfer of wrinkles of the mold release film to the surface of the resin-encapsulation portion.

The tensile modulus of elasticity of the mold release film can be adjusted by adjusting the crystallinity of the resin for the mold release film. Specifically, the lower the crystallinity of the resin for the mold release film, the lower the tensile modulus of elasticity of the mold release film. For example, in the case of the ethylene/tetrafluoroethylene copolymer, the crystallinity of the resin for the mold release film can be adjusted by adjusting the type and proportion of the units based on another monomer other than tetrafluoroethylene and ethylene.

Peel Force:

In the mold release film of the present invention, the maximum value of the peel force at the first surface side is preferably at most 0.8 N/25 mm, particularly preferably at most 0.5 N/25 mm. When the maximum value of the peel force is at most the upper limit value in the above range, during the production, peeling from a resin-encapsulation portion (a cured product of a curable resin) becomes easier. It will be less likely to happen that the apparatus has to be stopped as a mold release film and a resin-encapsulation portion are hardly peeled, and thus, continuous productivity will be excellent.

The "peel force" in the present invention represents a value measured by the following procedure of (a) to (f) in accordance with JIS K6854-2: 1999 (ISO 8510-2 1990).

(a) A suitable amount of an epoxy resin is disposed between a mold release film and an aluminum plate disposed on the first surface side of the mold release film.

(b) The mold release film and the aluminum plate sandwiching the epoxy resin are pressed at 180° C. under 10 MPa for 5 minutes, to cure the epoxy resin.

(c) A laminate of the mold release film, the cured epoxy resin and the aluminum plate is cut in a width of 25 mm to prepare five test pieces. Here, the thickness of the epoxy resin in the laminate is 100 μm.

(d) With respect to the test pieces, the 180° peel force at room temperature is measured at a rate of 100 mm/min by using a tensile tester.

(e) In the force (N)-grasp moving distance curve, an average value (unit: N/25 mm) of the peel force from a grasp moving distance of 25 mm to 125 mm, is obtained.

(f) An arithmetic mean of the average peel force values of the five test pieces, is obtained.

(Resin for Mold Release Film)

The mold release film is required to have releasability, heat resistance capable of withstanding the temperature of the mold during molding (typically from 150 to 180° C.) and strength capable of withstanding the flow and pressure of the curable resin.

The mold release film of the present invention is preferably a film made of at least one resin selected from the group consisting of a polyolefin and a fluororesin, particularly preferably a film made of a fluororesin, from the viewpoint of releasability, heat resistance, strength and elongation at a high temperature.

The mold release film of the present invention may be a film having a fluororesin and a non-fluororesin combined, or a film having an inorganic additive, an organic additive, etc. incorporated.

The mold release film of the present invention may be a film of one layer or may be a laminate film of two or more layers. From the viewpoint of the production cost, a film of one layer is preferred.

The mold release film of the present invention is particularly preferably a film made of one layer of a fluororesin.

As the polyolefin, polymethylpentene is preferred from the point of releasability and mold followability. One of polyolefins may be used alone, or two or more of them may be used in combination.

As the fluororesin, an ethylene/tetrafluoroethylene copolymer (hereinafter referred to also as ETFE), polytetrafluoroethylene, a perfluoro(alkyl vinyl ether)/tetrafluoroethylene copolymer, or the like, may be mentioned. Among these, ETFE is particularly preferred, since the elongation at a high temperature is large. One of fluororesins may be used alone, or two or more of them may be used in combination. Likewise, one of ETFE may be used alone, or two or more of them may be used in combination.

ETFE is a copolymer comprising units based on tetrafluoroethylene (hereinafter referred to also as TFE) and units based on ethylene (hereinafter referred to also as E).

ETFE is preferably one having units based on a third monomer (another monomer other than TFE and E). It is easy to adjust the crystallinity of the resin for the mold release film i.e. the tensile modulus of elasticity of the mold release film, by the type and content of units based on the third monomer. Further, by having units based on the third monomer (especially a monomer having fluorine atoms), the tensile strength and elongation at a high temperature (especially at about 180° C.) will be improved.

As the third monomer, a monomer having fluorine atoms or a monomer having no fluorine atom may be mentioned.

As specific examples of the monomer having fluorine atoms, the following monomers (a1) to (a5) may be mentioned.

Monomer (a1): a fluoroolefin having at most 3 carbon atoms.

Monomer (a2): a perfluoroalkyl ethylene represented by $X(CF_2)_nCY=CH_2$ (wherein, each of X and Y which are independent of each other, is a hydrogen atom or a fluorine atom, and n is an integer of from 2 to 8).

Monomer (a3): a fluorovinylether.

Monomer (a4): a functional group-containing fluorovinylether.

Monomer (a5): a fluorinated monomer having an aliphatic ring structure.

The monomer (a1) may, for example, be a fluoroethylene (such as trifluoroethylene, vinylidene fluoride, vinyl fluoride or chlorotrifluoroethylene), or a fluoropropylene (such as hexafluoropropylene (hereinafter referred to also as HFP), or 2-hydropentafluoropropylene).

The monomer (a2) is preferably a monomer wherein n is from 2 to 6, particularly preferably a monomer wherein n is from 2 to 4. Also, a monomer wherein X is a fluorine atom, and Y is a hydrogen atom, i.e. a (perfluoroalkyl)ethylene, is particularly preferred.

Specific examples of the monomer (a2) include the following ones.

$CF_3CF_2CH=CH_2$,
$CF_3CF_2CF_2CF_2CH=CH_2$ ((perfluorobutyl)ethylene; hereinafter referred to as PFBE),
$CF_3CF_2CF_2CF_2CF=CH_2$,
$CF_2HCF_2CF_2CF=CH_2$,
$CF_2HCF_2CF_2CF_2CF=CH_2$, etc.

Specific examples of the monomer (a3) include the following ones. Here, among the following, a monomer which is a diene, is a cyclo-polymerizable monomer.

$CF_2=CFOCF_3$,
$CF_2=CFOCF_2CF_3$,
$CF_2=CF(CF_2)_2CF_3$ (perfluoro(propyl vinyl ether); hereinafter referred to also as PPVE),
$CF_2=CFOCF_2CF(CF_3)O(CF_2)_2CF_3$,
$CF_2=CFO(CF_2)_3O(CF_2)_2CF_3$,
$CF_2=CFO(CF_2CF(CF_3)O)_2(CF_2)_2CF_3$,
$CF_2=CFOCF_2CF(CF_3)O(CF_2)_2CF_3$,
$CF_2=CFOCF_2CF=CF_2$,
$CF_2=CFO(CF_2)_2CF=CF_2$, etc.

Specific examples of the monomer (a4) include the following ones.

$CF_2=CFO(CF_2)_3CO_2CH_3$,
$CF_2=CFOCF_2CF(CF_3)O(CF_2)_3CO_2CH_3$,
$CF_2=CFOCF_2CF(CF_3)O(CF_2)_2SO_2F$, etc.

Specific examples of the monomer (a5) include perfluoro (2,2-dimethyl-1,3-dioxole), 2,2,4-trifluoro-5-trifluoromethoxy-1,3-dioxole, perfluoro(2-methylene-4-methyl-1,3-dioxolane), etc.

As examples of the monomer having no fluorine atom, the following monomers (b1) to (b4) may be mentioned.

Monomer (b1): an olefin.
Monomer (b2): a vinyl ester.
Monomer (b3): a vinyl ether.
Monomer (b4): an unsaturated acid anhydride.

Specific examples of the monomer (b1) include propylene, isobutene, etc.

Specific examples of the monomer (b2) include vinyl acetate, etc.

Specific examples of the monomer (b3) include ethyl vinyl ether, butyl vinyl ether, cyclohexyl vinyl ether, hydroxybutyl vinyl ether, etc.

Specific examples of the monomer (b4) include maleic anhydride, itaconic anhydride, citraconic anhydride, himic anhydride (5-norbornene-2,3-dicarboxylic acid anhydride), etc.

One of the third monomers may be used alone, or two or more of them may be used in combination.

The third monomer is preferably the monomer (a2), HFP, PPVE or vinyl acetate, more preferably HFP, PPVE, $CF_3CF_2CH=CH_2$ or PFBE, particularly preferably PFBE, in that adjustment of the crystallinity, i.e. the tensile modulus of elasticity, will be thereby easy, and by having units based on a third monomer (especially a monomer having fluorine atoms), the tensile strength and elongation at a high temperature (particularly at about 180° C.) will be improved.

That is, as ETFE, particularly preferred is a copolymer having units based on TFE, units based on E and units based on PFBE.

In ETFE, the molar ratio (TFE/E) of units based on TFE to units based on E is preferably from 80/20 to 40/60, more preferably from 70/30 to 45/55, particularly preferably from 65/35 to 50/50. When TFE/E is within the above range, the heat resistance and mechanical properties of ETFE will be excellent.

The proportion of units based on the third monomer in ETFE is preferably from 0.01 to 20 mol %, more preferably from 0.10 to 15 mol %, particularly preferably from 0.20 to 10 mol %, based on the total (100 mol %) of all units constituting ETFE. When the proportion of units based on the third monomer is within the above range, the heat resistance and mechanical properties of ETFE will be excellent.

In a case where the units based on the third monomer contains units based on PFBE, the proportion of units based on PFBE is preferably from 0.5 to 4.0 mol %, more preferably from 0.7 to 3.6 mol %, particularly preferably from 1.0 to 3.6 mol %, based on the total (100 mol %) of all units constituting ETFE. When the proportion of units based on PFBE is within the above range, it is possible to adjust the tensile modulus of elasticity at 180° C. of the mold release film to be in the above-mentioned range. Further, the tensile strength and elongation at a high temperature (especially at about 180° C.) will be improved.

The melt flow rate (MFR) of ETFE is preferably from 2 to 40 g/10 min, more preferably from 5 to 30 g/10 min, particularly preferably from 10 to 20 g/10 min. When MFR of ETFE is within the above range, the moldability of ETFE will be improved, and the mechanical properties of the mold release film will be improved.

MFR of ETFE is a value as measured under a load of 49 N at 297° C. in accordance with ASTM D3159.

(Method for Producing Mold Release Film)

The method for producing the mold release film of the present invention is not particularly limited, and a known production method may be used. For example, methods may be mentioned wherein irregularities of a base mold are transferred to a surface of a resin film by thermal processing, and from the viewpoint of productivity, the following methods (i), (ii), etc. are preferred, and the method (ii) is particularly preferred.

(i) A method wherein a resin film is passed between two rolls, so that irregularities formed on the surface of a roll are continuously transferred to a surface of the resin film on which irregularities are to be formed (the surface to be a surface of the mold release film having irregularities formed thereon).

(ii) A method wherein a resin extruded from an extruder die is passed between two rolls, so that at the same time as molding the resin into a film, irregularities formed on the surface of a roll are continuously transferred to a surface of the resin film on which irregularities are to be formed (the surface to be a surface of the mold release film having irregularities formed thereon).

In the method (i) or (ii), by using a roll-shaped die, continuous processing becomes possible, and the productivity of the mold release film having irregularities is remarkably improved. At the same time, since the mold release film will be a rolled type, in the production of a semiconductor package, it is possible to use a commonly employed compression molding apparatus or transfer molding apparatus having a feeding mechanism and a winding mechanism of the mold release film.

Further, by using, as one of the two rolls, a roll having irregularities on its surface (hereinafter referred to also as a die roll), and as the other roll, a roll having no irregularities, a mold release film having irregularities on one surface is produced. By using a die roll for each of the two rolls, a mold release film having irregularities on both surfaces is produced. Here, one of the two rolls usually has a function for pressing the resin film, and it is called a pressing roll. In a case where a roll having no irregularities on its surface is to be used, the roll having no irregularities is usually used as a cooling roll, and in a case where the two rolls are both die rolls, one of them is used a cooling roll. Here, a roll having no irregularities on its surface is meant also for a roll having a surface capable of forming a substantially smooth surface.

Method (i):

The resin film may be a commercially available one or may be one produced by a known production method. For example, by using a resin for a mold release film, it is possible to produce a resin film by e.g. melt molding by an extruder equipped with a T die having a predetermined lip width.

The surface temperature of the two rolls and the linear pressure may vary depending on the material and thickness of the mold release film, but it is preferred to satisfy the following three conditions simultaneously. Hereinafter, Tg is meant for a glass transition temperature of a resin to be molded, and Tm is meant for a melting point of a resin to be molded.

Roll surface temperature: Tg+30° C. to Tm−20° C.
Linear pressure between two rolls: 20 to 300 N/cm.
Value of tensile modulus of elasticity (MPa)/linear pressure (N/cm): 0.005 to 0.02.

Here, the tensile modulus of elasticity is meant for a tensile modulus of elasticity of the material for the mold release film, at the surface temperature of the two rolls.

When it satisfies the above three conditions, the resin material maintains rubber-like elasticity while having a low elastic modulus of elasticity, and, when it is pressed between the two rolls, it is easy to form irregularities only on its surface without significantly changing the overall thickness.

Further, the processing speed is preferably from 0.2 to 100 m/min.

Method (ii):

The resin extruded from a slit of the die is withdrawn along the mold rolls set at a temperature of at most the melting point of the resin, whereby the shape is fixed, and at the same time, the thickness is determined by the extrusion amount adjusted by the rotational speed of the screw of the extruder, and the width of the slit of the die and the withdrawing speed adjusted by the rotational speed of the mold rolls.

The relation of the pressure between the two rolls and the melt viscosity of the resin at a temperature immediately after extruded from the die, preferably satisfies the following conditions.

Melt viscosity (Pa·s)/pressure (N/cm): 2 to 50

Here, the melt viscosity is a measured value of the apparent melt viscosity ηap represented by the following formula (II), when the apparent shear rate γap is 10/sec, at the time of flowing a predetermined volume flow amount by means of a capillary die (inner diameter: 1 mm, length: 10 mm) in accordance with JIS K7199: 1999 (ISO11443: 1995). The temperature at that time is equal to the temperature of the resin immediately before contact with the rolls after extruded from the die, in the method (ii).

Apparent melt viscosity ηap (Pas)=apparent shear stress τap (Pa)/apparent shear rate γap (1/sec)  (II)

Apparent shear stress τap=pD/4 L
p: test pressure (Pa)
D: capillary inner diameter (mm)
L: capillary length (mm)
Apparent shear rate γap=$32Q/\pi D^3$
Q: volume flow rate (mm$^3$/sec.)

If the value of the above melt viscosity/pressure is larger than 50, the transfer rate of irregularities in the roll sharply decreases, and Ra tends to be hardly imparted even if a roll having a large surface roughness is employed. If it is smaller than 2, the melted resin is likely to be crushed too much, thus leading to such a problem that holes will be formed in the film at the most roughened areas.

The pressure between the two rolls is preferably from 10 N/cm to 150 N/cm. When it is at least 10 N/cm, or more, slipping is unlikely to occur between the two rolls. When it is at most 150 N/cm, "fatigue" due to collapse of the rolls can be avoided.

The roll surface temperature is preferably from Tg+30° C. to Tg+80° C. In this method, since the surface temperature of the rolls is raised by the amount of heat supplied from the molten resin, the above condition is satisfied often under normal molding conditions.

The processing speed is preferably in the same range as in the method (i).

Die Roll:

As a die roll, a rubber wound roll, a resin wound roll, a paper wound roll, a metal roll, a ceramic roll, a resin roll or the like may be mentioned. In order to increase the hardness, the surface of the metallic die roll may be subjected to surface modification such as ceramic coating, ceramic sintering, ceramic deposition, hard metal spraying, plating, carburizing, nitriding, etc.

Among them, a rubber wound roll is preferred with a view to reducing the burden on the other roll, and since it is easy to adjust RPc by the amount of particles to be mixed.

Irregularities on the surface of the die roll have a shape having the specific irregularities of the mold release film inverted and have the same shape as irregularities formed on the surface of the resin-encapsulation portion of the semiconductor package.

As a method for forming irregularities on the surface of the die roll, a method of cutting, etching or the like may be mentioned.

In the case of a rubber wound roll, by blending particles to a rubber sheet to be wound on the surface, it is possible to obtain a die roll having irregularities on its surface. In such a case, the roughness depth, i.e. Ra, can be adjusted by the size of the particles to be blended in the rubber sheet. Further, the number of peaks of the roughness, i.e. RPc, can be adjusted by the blended amount of particles, i.e. by the blending density. Also in the case of a resin wound roll, Ra and RPc can be adjusted in the same manner.

It is preferred that Ra of the die roll is from 1.6 to 4.2. Further, it is preferred that RPc of the die roll is from 80 to 240. Although it may depend on the viscosity and pressure conditions of the resin, the transfer rate of Ra of a roll to the resin is usually from about 60 to 80% so long as the above-mentioned molding conditions are satisfied by the method (1) or the method (2). Further, the transfer rate of RPc of a roll to the resin is usually from 80 to100%.

When the above-mentioned production conditions are satisfied, the transfer rates of Ra and RPc of a roll tend to readily satisfy the above ranges.

In the case of a rubber wound roll, as a rubber component of the rubber roll, silicone rubber, crosslinked isoprene rubber, cross-linked butylene-isoprene copolymer rubber or the like is used. As inorganic fine particles, silica, zeolite, calcined clay, vermiculite, talc, mica and a alumina may be mentioned. The average particle diameter of the particles is preferably from 1 to 100 μm. The amount to be incorporated is preferably from 5 to 80 parts by weight. Ra can be controlled by the average size of the particles, and RPc can be controlled by the amount to be incorporated.

Cooling Roll:

As a cooling roll, the same as the die roll may be mentioned. However the surface of the cooling roll may be smooth or may have irregularities formed thereon.

In a case where the surface of the cooling roll is smooth, a mold release film smooth on one side is obtainable, and in a case where irregularities of the shape having the specific irregularities inverted, are formed on the surface of the cooling roll, a mold release film having the specific irregularities formed on both surfaces is obtainable.

Since the thermal processing temperature of a fluororesin is relatively high, in a case where a fluororesin is used as the material for a mold release film, a material having high heat resistance is preferred as the material for the roll. The heat resistance temperature of the roll material is preferably at least 150° C. Therefore, as the material for the cooling roll, from the viewpoint of the heat resistance and durability, metal, ceramic, silicone rubber or aramid paper is preferred. In order to increase the hardness, the surface of the metallic cooling roll may be subjected to surface modification such as ceramic coating, ceramic sintering, ceramic deposition, hard metal spraying, plating, carburizing, nitriding, etc.

In the method (i) or (ii), Ra and RPc can be adjusted by adjusting, other than irregularities on the surface of the roll, the processing speed, MFR of a resin for the mold release film, the pressing pressure of rolls, the distance between the die and the roll, etc.

For example, when the same die roll is used, as the processing speed is higher, Ra and RPc tend to be large. However, when the above-mentioned production conditions and the above-described rolls are adopted, it becomes easiest to produce a film with Ra being from 1.3 to 2.5 and RPc being from 80 to 200.

(Advantageous Effects)

When the mold release film of the present invention is disposed in a cavity of a mold for forming a resin-encapsulation portion by encapsulating a semiconductor element of a semiconductor package with a curable resin, so that the surface having irregularities satisfying the specific Ra and RPc, is in contact with the cavity surface (that is, when the surface having irregularities satisfying the specific Ra and RPc is the second surface), the mold release film of the present invention is stretched along the cavity surface by vacuum suction, is brought in close contact with the cavity surface and is shaped to follow the mold.

In a case where the second surface of the mold release film of the present invention is a surface having the specific irregularities, the thickness of the mold release film is preferably from 40 to 75 μm. Since the thickness is at most 75 μm, the mold release film of the present invention can be easily deformed and is excellent in followability to the shape of the mold cavity. Further, since the thickness is at least 40 μm, the mold release film of the present invention has a certain elasticity.

Further, since Ra of the second surface is at least 1.3 μm and RPc is at least 80, at the time of the above-mentioned vacuum suction, the mold release film slips well on the cavity surface, and air is unlikely to remain between the mold release film and the cavity surface. Therefore, wrinkles are unlikely to be formed at the time of letting the mold release film follow the mold. Further, since Ra is at most 2.5 μm and RPc is at most 200, at the time of letting the mold release film follow the mold, the pinholes are unlikely to be formed in the mold release film, and leakage of the resin is unlikely to occur.

Further, since the mold release film of the present invention has the second surface having irregularities formed to satisfy the specific Ra and RPc, when pulled out from the rolled state, electrification by peeling of the mold release film from the rolled state is unlikely to occur. Therefore, at the time of producing a semiconductor package by using the mold release film pulled out from the rolled state, foreign matters are unlikely to adhere to the mold release film, and deterioration of the external appearance of the semiconductor package due to such foreign matters is unlikely to occur.

Therefore, according to the mold release film of the present invention, it is possible to reduce poor appearance of the resin-encapsulation portion in the step of encapsulation of a semiconductor element. Further, adhesion of the curable resin to the mold, or the frequency of e.g. a cleaning step for removing the deposited curable resin can be reduced. Thus, the productivity of the semiconductor package can be improved.

Further, when the mold release film of the present invention is disposed on the cavity surface of a mold so that the surface having the specific irregularities is in contact with a curable resin (i.e. when the surface having irregularities that satisfy the specific Ra and RPc is the first surface), the irregularities on the surface of the mold release film will be accurately transferred to the surface of the resin-encapsulation portion.

The resin-encapsulation portion having irregularities formed on its surface by such transfer, is unlikely to be susceptible to chipping or cracking at the time of singulation. Further, the surface is excellent in adhesion to the ink layer.

Further, after the encapsulation step, at the time of peeling the mold release film and the resin-encapsulation portion (a cured product of the curable resin), the apparent contact area between the mold release film and the resin-encapsulation portion decreases, whereby peeling electrification can be reduced. That is, it is possible to reduce a damage to the semiconductor element due to electric discharge at the time of peeling the mold release film. This effect is particularly remarkable when an epoxy resin having a large molding shrinkage is used. Thus, by using the mold release film of the present invention, it is possible to produce a semiconductor package having no chipping or cracking in the resin-encapsulation portion, wherein an ink layer formed on the surface of the resin-encapsulation portion is unlikely to be peeled. Further, at that time, the production stability will also be excellent.

[Semiconductor Package]

A semiconductor package to be produced by the process for producing a semiconductor package by using the mold release film of the present invention may be any one so long as it is produced via collective encapsulation and singulation, and, for example, a semiconductor package wherein the encapsulation system is a MAP (Moldied Array Packaging) method or a WL (Wafer Label packaging) method, may be mentioned.

The shape of the semiconductor package may, for example, be BGA (Ball Grid Array), QFN (Quad Flat Non-leaded package) or SON (Small Outline Non-leaded package).

FIG. 1 is a schematic cross-sectional view showing an example of a semiconductor package. The semiconductor package 1 of this example is a semiconductor package of a so-called MAP-BGA shape.

The semiconductor package 1 comprises a substrate 10, a semiconductor chip (semiconductor element) 12 mounted on the substrate 10, a resin-encapsulation portion 14 for encapsulating the semiconductor chip 12 and an ink layer 16 which is formed on the upper surface 14a of the resin-encapsulation portion 14.

The semiconductor chip 12 has a surface electrode (not shown), the substrate 10 has a substrate electrode (not shown) corresponding to the surface electrode of the semiconductor chip 12, and the surface electrode and the substrate electrode are electrically connected by a bonding wire 18.

Irregularities, etc. of the first surface of the mold release film of the present invention have been accurately transferred to the upper surface 14a of the resin-encapsulation portion 14, and in a case where the first surface of the mold release film of the present invention is a surface having the specific irregularities, Ra of the upper surface 14a is from 1.3 to 2.5 μm, and RPc is from 80 to 200.

The thickness of the resin-encapsulation portion 14 (the shortest distance from the semiconductor chip 12-mounted surface of the substrate 10 to the upper surface 14a of the resin-encapsulation portion 14) is not particularly limited, but is preferably at least "the thickness of the semiconductor chip 12" and at most "the thickness of the semiconductor chip 12+1 mm", particularly preferably at least "the thickness of the semiconductor chip 12" and at most "the thickness of the semiconductor chip 12+0.5 mm".

According to a study by the present inventors, chipping or cracking of the resin-encapsulation portion during singulation is more likely to occur as the semiconductor package 1 becomes thinner, and therefore, as the thickness of the resin-encapsulation portion 14 becomes thinner, usefulness of the present invention capable of preventing such chipping or cracking during singulation, is high.

[Process for Producing Semiconductor Package]

The process for producing a semiconductor package of the present invention is
the following process (1) or process (2).

Process (1) for producing a semiconductor package of the present invention:

A process for producing a semiconductor package formed of a semiconductor element and a curable resin and having a resin-encapsulation portion for encapsulating the semiconductor element, which comprises a step of disposing the mold release film of the present invention and having the irregularities formed at least on the second surface, on a cavity surface of a mold to be in contact with the curable resin, so that the first surface faces the space in the cavity, a step of disposing a substrate having a semiconductor element mounted thereon, in the cavity, encapsulating the semiconductor element with the curable resin, and curing the curable resin in such a state that it is in contact with the mold release film, to form a resin-encapsulation portion, thereby to obtain an encapsulated product comprising the substrate, the semiconductor element mounted on the substrate and the resin-encapsulation portion for encapsulating the semiconductor element, and a step of releasing the encapsulated product from the mold.

Process (2) for producing a semiconductor package of the present invention:

A process for producing a semiconductor package formed of a semiconductor element and a curable resin and having a resin-encapsulation portion for encapsulating the semiconductor element, and an ink layer formed on the surface of the resin-encapsulation portion, which comprises a step of disposing the mold release film of the present invention and having the irregularities at least on the first surface, on a cavity surface of a mold to be in contact with the curable resin, so that the first surface faces the space in the cavity, a step of disposing a substrate having a plurality of semiconductor elements mounted thereon, in the cavity, encapsulating the plurality of semiconductor elements collectively with the curable resin, and curing the curable resin in such a state that it is in contact with the mold release film, to form a resin-encapsulation portion, thereby to obtain a collectively encapsulated product comprising the substrate, the plurality of semiconductor elements mounted on the substrate and the resin-encapsulation portion for collectively encapsulating the plurality of semiconductor elements, a step of cutting the substrate and the resin-encapsulation portion of the collectively encapsulated product so that the plurality of semiconductor elements are separated, to obtain singulated encapsulated products each having a substrate, at least one semiconductor element mounted on the substrate, and a resin-encapsulation portion for encapsulating the semiconductor element, and a step of forming an ink layer by using an ink, on the surface which was in contact with the mold release film, of the resin-encapsulation portion of the collectively encapsulated product or the singulated encapsulated product.

For the process for producing a semiconductor package of the present invention, a known production process may be employed except for the use of the mold release film of the present invention.

For example, as a method of forming the resin-encapsulation portion, the compression molding method or transfer molding method may be mentioned, and as an apparatus to be used in such a case, it is possible to use a known compression-molding apparatus or transfer molding apparatus. The production conditions may also be the same as the conditions in a conventional method of producing a semiconductor package.

As the process for producing a semiconductor package of the present invention, depending upon the method for forming the resin-encapsulation portion, two types of the following process (α) and process (β) may be mentioned.

The process (α) is a process for forming a resin-encapsulation portion by a compression molding method, and the process (β) is a process for forming a resin-encapsulation portion by a transfer molding method.

Process (α): a process comprising the following steps (α1) to (α7).

(α1) A step of disposing the mold release film of the present invention, so that the mold release film covers the cavity of the mold, and the first surface of the mold release film faces the space in the cavity.

(α2) A step of vacuum sucking the mold release film to the side of the cavity surface of the mold.

(α3) A step of filling a curable resin into the cavity.

(α4) A step of disposing a substrate having a plurality of semiconductor elements mounted thereon at a predetermined position in the cavity, and collectively encapsulating the plurality of semiconductor elements by the curable resin to form a resin-encapsulation portion, thereby to obtain a collectively encapsulated product comprising the substrate, the plurality of semiconductor elements mounted on said substrate and the resin-encapsulation portion collectively encapsulating said plurality of semiconductor elements.

(α5) A step of taking out the collectively encapsulated product from the mold.

(α6) A step of cutting the substrate and the resin-encapsulation portion of the collectively encapsulated product, so that the plurality of semiconductor elements are separated, to obtain singulated encapsulated products, each comprising a substrate, at least one semiconductor element mounted on the substrate, and a resin-encapsulation portion encapsulating the semiconductor element.

(α7) A step of forming an ink layer by using an ink on the surface which was in contact with the mold release film, of the resin-encapsulated portion of each singulated encapsulated product, to obtain a semiconductor package.

Process (β): a process comprising the following steps (β1) to (β7).

(β1) A step of disposing the mold release film of the present invention, so that the mold release film covers the cavity of the mold, and the first surface of the mold release film faces the space in the cavity.

(β2) A step of vacuum sucking the mold release film to the side of the cavity surface of the mold.

(β3) A step of disposing a substrate having a plurality of semiconductor elements mounted thereon at a predetermined position in the cavity.

(β4) A step of filling a curable resin into the cavity, and collectively encapsulating the plurality of semiconductor elements by the curable resin to form a resin-encapsulation portion, thereby to obtain a collectively encapsulated product comprising the substrate, the plurality of semiconductor elements mounted on said substrate and the resin-encapsulation portion collectively encapsulating said plurality of semiconductor elements.

(β5) A step of taking out the collectively encapsulated product from the mold.

(β6) A step of cutting the substrate and the resin-encapsulation portion of the collectively encapsulated product, so that the plurality of semiconductor elements are separated, to obtain singulated encapsulated products, each comprising a substrate, at least one semiconductor element mounted on the substrate, and a resin-encapsulation portion encapsulating the semiconductor element.

(β7) A step of forming an ink layer by using an ink on the surface which was in contact with the mold release film, of the resin-encapsulated portion of each singulated encapsulated product, to obtain a semiconductor package.

First Embodiment

As one embodiment of the process for producing a semiconductor package, a case of producing a semiconductor package 1 as shown in FIG. 1 by the process (α), will be described in detail.

Figure 2:
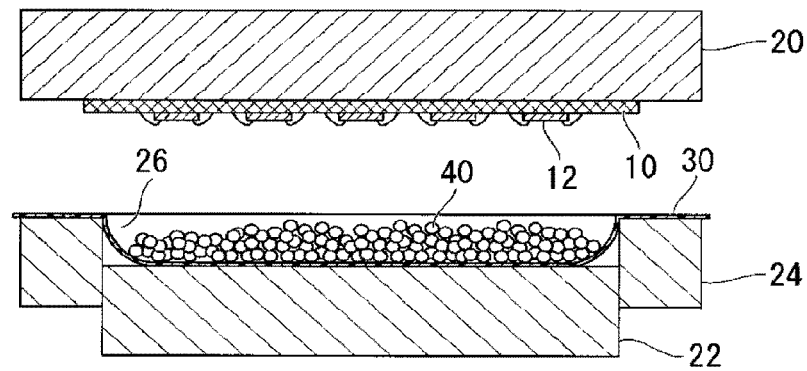
FIG. 2 is a cross-sectional view illustrating schematically the step (α3) in the first embodiment of the process for producing a semiconductor package of the present invention.

Mold:

As the mold in the first embodiment, it is possible to use one known as a mold to be used for compression molding, and for example, as shown in FIG. 2, a mold comprising a stationary upper mold 20, a cavity bottom member 22, and a frame-shaped movable lower mold 24 disposed at the periphery of the cavity bottom member 22, may be mentioned.

In the stationary upper mold 20, a vacuum vent (not shown) for adsorbing a substrate 10 to the stationary upper mold 20 by sucking air between the substrate 10 and the stationary upper mold 20, is formed. Further, in the cavity bottom member 22, a vacuum vent (not shown) for adsorbing a mold release film 30 to the cavity bottom member 22 by sucking air between the mold release film 30 and the cavity bottom member 22, is formed.

In this mold, a cavity 26 having a shape corresponding to the shape of a resin-encapsulation portion 14 to be formed in the step (α4) is formed by the upper surface of the cavity bottom member 22 and the inner side surfaces of the movable lower mold 24.

Hereinafter, the top surface of the cavity bottom member 22 and the inner side surfaces of the movable lower mold 24 may be collectively referred to also as the cavity surface.

Step (α1):

On the movable lower mold 24, the mold release film 30 is disposed so as to cover the upper surface of the cavity bottom member 22. At that time, the mold release film 30 is disposed so that the first surface is directed to the upper side (a direction opposite to the cavity bottom member 22 direction).

The mold release film 30 is fed from an unwinding roll (not shown) and is wound up on a winding roll (not shown). The mold release film 30 is pulled by the unwinding roll and the winding roll, and therefore will be disposed, in a stretched state, on the movable lower mold 24.

Step (α2):

Separately, by vacuum suction through the vacuum vent (not shown) of the cavity bottom member 22, the space between the upper surface of the cavity bottom member 22 and the mold release film 30 is evacuated, so that the mold release film 30 is stretched, deformed and vacuum-adsorbed on the upper surface of the cavity bottom member 22. Further, by tightening the frame-shaped movable lower mold 24 disposed at the periphery of the cavity bottom member 22, the mold release film 30 is pulled from all directions to be in tension.

Here, the mold release film 30 may not necessarily be in close contact with the cavity surface, depending upon the strength and thickness of the mold release film 30 in a high temperature environment, and the shape of the concave formed by the upper surface of the cavity bottom member 22 and the inner side surfaces of the movable lower mold 24. At the stage of vacuum suction in the step (α2), as shown in FIG. 2, a void space may be slightly left between the mold release film 30 and the cavity surface.

Step (α3):

As shown in FIG. 2, a curable resin 40 is loaded in a suitable amount onto the mold release film 30 in the cavity 26 by an applicator (not shown).

Further, separately, by vacuum suction through a vacuum vent (not shown) of the stationary upper mold 20, a substrate 10 having a plurality of semiconductor chips 12 mounted thereon, is vacuum adsorbed on the lower surface of the stationary upper mold 20.

As the curable resin 40, various curable resins used in the production of semiconductor packages may be used. A thermosetting resin such as an epoxy resin or a silicone resin is preferred, and an epoxy resin is particularly preferred.

As an epoxy resin, for example, SUMIKON EME G770H type F ver GR manufactured by Sumitomo Bakelite Co., Ltd., and T693/R4719-SP10 manufactured by Nagase ChemteX Corporation, may be mentioned.

As commercial products of a silicone resin, LPS-3412AJ and LPS-3412B manufactured by Shin-Etsu Chemical Co., Ltd., may, for example, be mentioned.

In the present invention, the curable resin 40 is preferably a resin having a high molding shrinkage, particularly since peeling electrification can thereby be prevented.

The molding shrinkage of a curable resin being large is usually not preferred from the viewpoint of accurately forming a resin-encapsulation portion of a desired shape. However, according to a study by the present inventors, when the molding shrinkage is large, the curable resin shrinks during curing, and at irregularities of the mold release film, the apparent contact area decreases. When the contact area to the mold release film is small, at the time of peeling the mold release film from the resin-encapsulation portion (a cured product of the curable resin), it is possible to suppress electrification of the mold release film by peeling, and damage to the semiconductor element due to electric discharge from the mold release film is unlikely to occur.

The molding shrinkage of the curable resin 40 is preferably from 0.05 to 0.15%, particularly preferably from 0.1 to 0.13%. When the mold shrinkage is at least the lower limit value in the above range, the apparent contact area between the irregularities of the mold release film and the resin-encapsulation portion, sufficiently decreases, and it is possible to prevent peeling electrification. When the molding shrinkage is at most the upper limit value in the above range, warpage of the semiconductor package will be small, such being suitable for practical use.

The molding shrinkage of the curable resin 40 is a value measured at the time of transfer molding under molding conditions at a temperature of 180° C. under a pressure of 7 MPa for a time of 5 minutes in accordance with JIS K6911-1995 5.7. That is, using a mold having a predetermined shape, the curable resin 40 is molded under the above molding conditions. After molding, the molded product is taken out from the mold and left to cool in air. The cooling is conducted by leaving the product to stand still in an environment within 23±2° C. within a relative humidity of 50±5% for 24±1 hour. The difference between the size of the molded product after cooling and the size of the mold is a molding shrinkage, and the percentage of the molding shrinkage to the size of the mold is a molding shrinkage percent.

The curable resin 40 may contain carbon black, fused silica, crystalline silica, alumina, silicon nitride, aluminum nitride, etc.

Here, a case of filling a solid one as the curing resin 40 has been described, but the invention is not limited to this, and a curable liquid resin may be filled.

Figure 3:
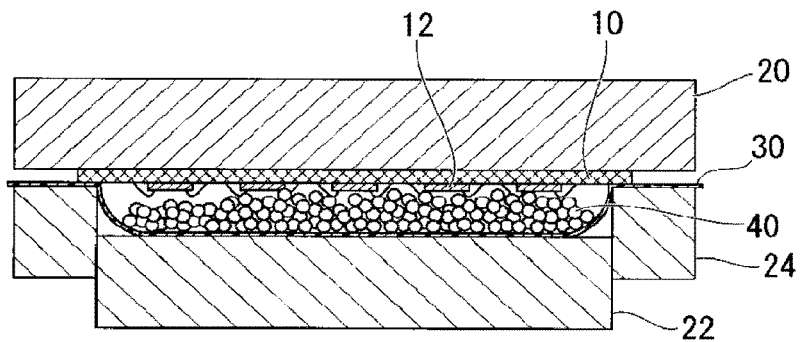
FIG. 3 is a cross-sectional view illustrating schematically the step (α4) in the first embodiment of the process for producing a semiconductor package of the present invention.

Step (α4):

As shown in FIG. 3, in such a state that the curable resin 40 is filled on the mold release film 30 in the cavity 26, the cavity bottom member 22 and the movable lower mold 24 are raised and clamped to the stationary upper mold 20 for mold clamping.

Figure 4:
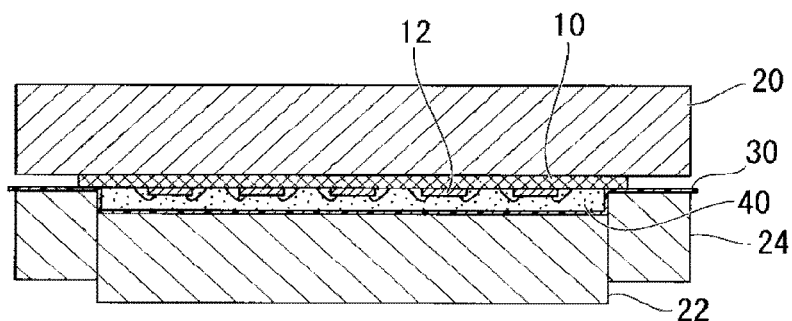
FIG. 4 is a cross-sectional view illustrating schematically the step (α4) in the first embodiment of the process for producing a semiconductor package of the present invention.

Then, as shown in FIG. 4, only the cavity bottom member 22 is raised and at the same time, the mold is heated to let the curable resin 40 be cured to form a resin-encapsulation portion 14 for encapsulating the semiconductor chips 12.

In the step (α4), by the pressure at the time of raising the cavity bottom member 22, the curable resin 40 filled in the cavity 26 is further pushed to the cavity surface. The mold release film 30 is thereby stretched and deformed to be closely in contact with the cavity surface. Therefore, the resin-encapsulation portion 14 having a shape corresponding to the shape of the cavity 26 will be formed. At that time, in a case where irregularities are formed on the first surface of the mold release film 30, the irregularities of the first surface will be transferred to the surface of the resin-encapsulation portion 14 which is in contact with the first surface of the mold release film 30.

The heating temperature of the mold, i.e. the heating temperature of the curable resin 40 is preferably from 100 to 185° C., particularly preferably from 150 to 180° C. When the heating temperature is at least the lower limit value in the above range, the productivity of the semiconductor package 1 is improved. When the heating temperature is at most the upper limit value in the above range, deterioration of the curable resin 40 is prevented.

From the viewpoint of suppressing a change in the shape of the resin-encapsulation portion 14 due to thermal expansion of the curable resin 40, when the protection of the semiconductor package 1 is particularly required, the heating is preferably conducted at the lowest possible temperature within the above range.

Step (α5):

The stationary upper mold 20, the cavity bottom member 22 and the movable lower mold 24 are mold-opened, and the collectively encapsulated product is taken out.

At the same time as releasing the collectively encapsulated product, the used portion of the mold release film 30 is sent to the winding roll (not shown), and the unused portion of the mold release film 30 is fed from the unwinding roll (not shown).

The thickness of the mold release film 30 at the time of being transported from the unwinding roll to the winding roll is preferably at least 16 μm. If the thickness is less than 16 μm, wrinkling is likely to occur during the transportation of the mold release film 30. If wrinkles are formed in the mold release film 30, such wrinkles are likely to be transferred to the resin-encapsulation portion 14, thus leading to a defective product. When the thickness is at least 16 μm, it is possible to apply a sufficient tension to the mold release film 30 so as to prevent formation of wrinkles.

Step (α6):

The substrate 10 and the resin-encapsulation portion 14 of the collectively encapsulated product taken out from the mold, are cut (singulated) so that the plurality of semiconductor chips 12 are separated, to obtain singulated encapsulated products each comprising a substrate 10, at least one semiconductor chip 12 and a resin-encapsulation portion for encapsulating the semiconductor chip 12.

Such singulation can be carried out by a known method, such as a dicing method. The dicing method is a method of cutting an object by rotating a dicing blade. As the dicing blade, typically a rotating blade (diamond cutter) having diamond powder sintered on the outer periphery of a disk, is used. Singulation by the dicing method can be carried out, for example, by a method wherein the collectively encapsulated product as an object to be cut, is fixed on the processing table via a jig, and the dicing blade is permitted to run in such a state that a space to insert the dicing blade is present between the jig and the cutting area of the object to be cut.

In the step (α6), after the step (cutting step) of cutting the collectively encapsulated product as described above, there may be included a foreign matter-removing step of moving the processing table while supplying a liquid to the cutting object from a nozzle disposed at a position apart from the case for covering the dicing blade.

Step (α7):

On the upper surface 14a (the surface which was in contact with the mold release film 30) of the resin-encapsulation portion 14 of the singulated encapsulated product obtained in step (α6), an ink is applied to form an ink layer 16 in order to display an optional information, to obtain a semiconductor package 1.

The information to be displayed by the ink layer 16 is not particularly limited, and a serial number, information about the manufacturers, a type of components, etc., may be mentioned.

The method for applying the ink is not particularly limited, and for example, various printing methods may be mentioned, such as ink jet printing, screen printing, transfer from a rubber plate, etc.

The ink is not particularly limited and may be suitably selected from known inks.

As a method for forming the ink layer 16, in view of a high curing speed, less bleeding on the package, and little positional displacement of the package as no hot air is applied, a method of using a photocurable ink is preferred, wherein the ink is applied by an ink-jet method on the upper surface 14a of the resin-encapsulation portion 14 and cured by irradiation with light.

As the photocurable ink, typically, one containing a polymerizable compound (monomer, oligomer, etc.) may be used. To the ink, as the case requires, a coloring material such as a pigment or a dye, a liquid medium (solvent or dispersant), a polymerization inhibitor, a photopolymerization initiator, other various additives, etc. may be added. Other additives include a slip agent, a polymerization accelerator, a penetration enhancer, a wetting agent (humectant), a fixing agent, a fungicide, a preservative, an antioxidant, a radiation absorber, a chelating agent, a pH adjusting agent, a thickeners, etc.

As the light to cure the photocurable ink, ultraviolet ray, visible ray, infrared ray, electron beam or radiation may, for example, be mentioned.

As the light source for ultraviolet ray, a germicidal lamp, an ultraviolet fluorescent lamp, a carbon arc, a xenon lamp, a high-pressure mercury lamp for copying, a medium-pressure or high-pressure mercury lamp, a super high pressure mercury lamp, an electrodeless lamp, a metal halide lamp, an ultraviolet light emitting diode, an ultraviolet laser diode, or natural light, may, for example, be mentioned.

Light irradiation may be carried out under normal pressure or under reduced pressure. It may be carried out in air, or in an inert gas atmosphere such as a nitrogen atmosphere or carbon dioxide atmosphere.

Here, in this embodiment, a case of conducting the steps (α6) and (α7) in this order, after the step (α5), has been described, but the steps (α6) and (α7) may be conducted in an reverse order. That is, an ink layer may be formed by using an ink on the surface which was in contact with the mold release film, of the resin-encapsulation portion of the collectively encapsulated product taken out of the mold, and thereafter, the substrate and the resin-encapsulation portion of the collectively encapsulated product may be cut.

Second Embodiment

Another embodiment of the process for producing a semiconductor package will be described in detail with reference to a case of producing a semiconductor package 1 shown in FIG. 1 by the process (β).

Figure 5:
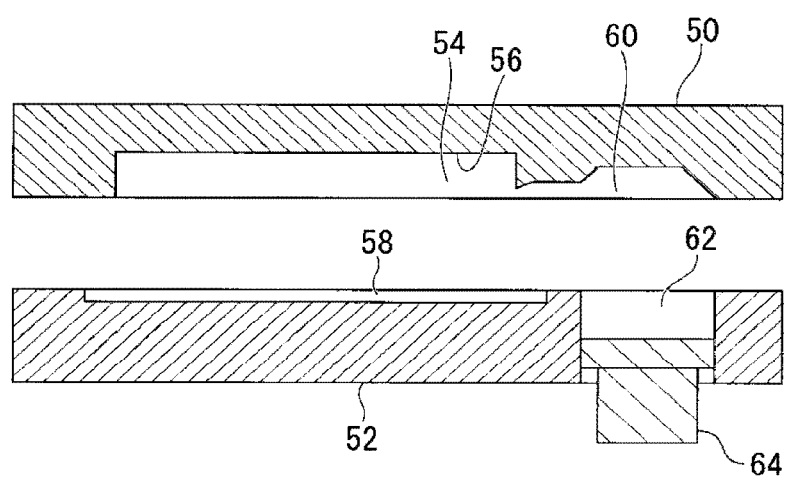
FIG. 5 is a cross-sectional view showing an example of a mold used in the second embodiment of the process for producing a semiconductor package of the present invention.

Mold:

As the mold in the second embodiment, it is possible to use one known as a mold to be used for a transfer molding method. For example, as shown in FIG. 5, a mold comprising an upper mold 50 and a lower mold 52, may be mentioned. In the upper mold 50, a cavity 54 having a shape corresponding to the shape of the resin-encapsulation portion 14 to be formed in the step (β4), and a concave-shaped resin-introducing portion 60 to introduce a curable resin 40 to the cavity 54 are formed. In the lower mold 52, a substrate placement portion 58 for placing a substrate 10 having semiconductor chips 12 mounted thereon, and a resin placement portion 62 for placing a curable resin 40 are formed. Further, in the resin placement portion 62, a plunger 64 is provided that pushes the curable resin 40 to the resin introducing portion 60 of the upper mold 50.

Figure 6:
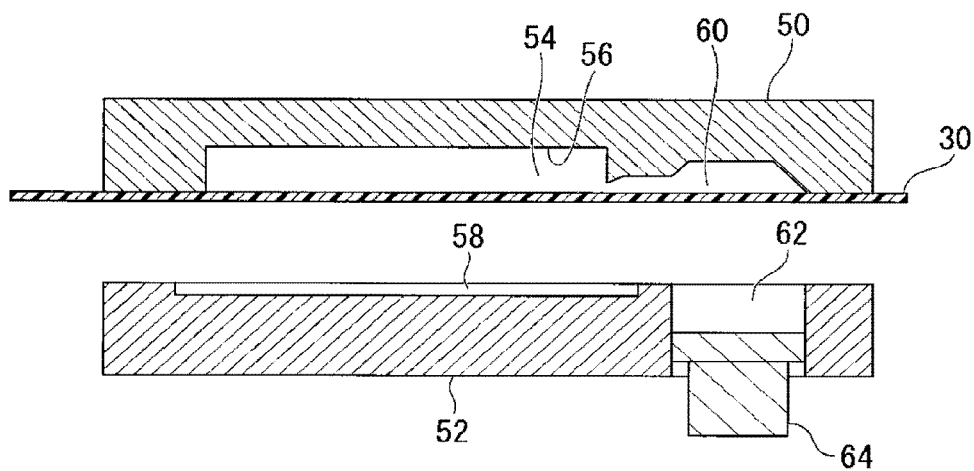
FIG. 6 is a cross-sectional view showing the step (β1) in the second embodiment of the process for producing a semiconductor package of the present invention.

Step (β1):

As shown in FIG. 6, the mold release film 30 is disposed to cover the cavity 54 of the upper mold 50. The mold release film 30 is preferably disposed so as to entirely cover the cavity 54 and the resin introducing portion 60. The mold release film 30 is pulled by the unwinding roll (not shown)

and the winding roll (not shown), whereby it is disposed to cover the cavity 54 of the upper mold 50 in a stretched state.

Figure 7:
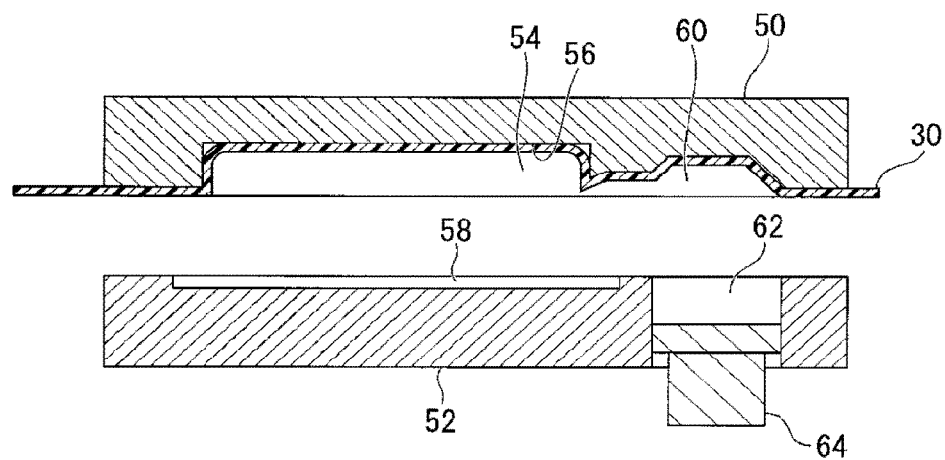
FIG. 7 is a cross-sectional view showing the step (β2) in the second embodiment of the process for producing a semiconductor package of the present invention.

Step (β2):

As shown in FIG. 7, by vacuum suction through a groove (not shown) formed outside of the cavity 54 of the upper mold 50, the space between the mold release film 30 and the cavity surface 56, and the space between the mold release film 30 and the inner wall of the resin introducing portion 60, are depressurized, so that the mold release film 30 is stretched, deformed and vacuum-adsorbed to the cavity surface 56 of the upper mold 50.

Here, the mold release film 30 may not always be in close contact with the cavity surface 56, depending upon the strength and thickness of the mold release film 30 in a high temperature environment and the shape of the cavity 54. As shown in FIG. 7, at the stage of the vacuum suction step (β32), a void space may be slightly left between the mold release film 30 and the cavity surface 56.

Figure 8:
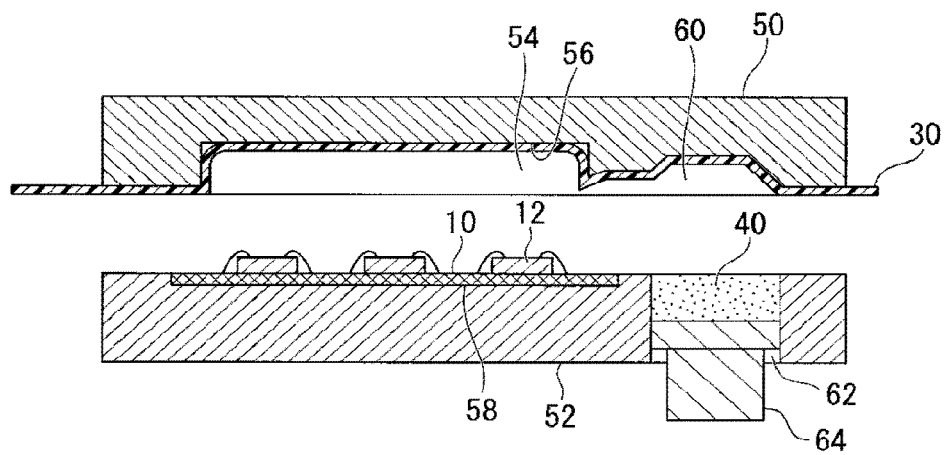
FIG. 8 is a cross-sectional view showing the step (β3) in the second embodiment of the process for producing a semiconductor package of the present invention.

Step (β3):

As shown in FIG. 8, the substrate 10 having the plurality of semiconductor chips 12 mounted thereon is placed on the substrate placement portion 58, and the upper mold 50 and the lower mold 52 are clamped so that the plurality of semiconductor chips 12 are disposed at a predetermined position in the cavity 54. Further, on the plunger 64 of the resin placement portion 62, the curable resin 40 is disposed in advance.

The curable resin 40 may be the same one as the curable resin 40 mentioned in the process (α).

Figure 9:
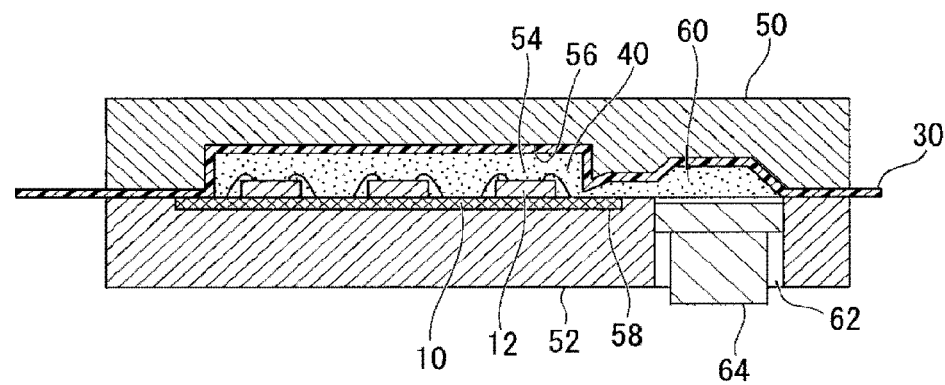
FIG. 9 is a cross-sectional view showing the step (β4) in the second embodiment of the process for producing a semiconductor package of the present invention.

Step (β4):

As shown in FIG. 9, the plunger 64 of the lower mold 52 is pushed up to fill the curable resin 40 into the cavity 54 through the resin introducing portion 60. Then, the mold is heated to cure the curable resin 40, thereby to form the resin-encapsulation portion 14 for encapsulating the plurality of semiconductor chips 12.

In the step (β4), as the curable resin 40 is filled into the cavity 54, the mold release film 30 is further pushed to the cavity surface 56 side by the resin pressure and stretched and deformed so that it will be in close contact with the cavity surface 56. Therefore, a resin-encapsulation portion 14 having a shape corresponding to the shape of the cavity 54 will be formed.

The heating temperature of the mold at the time of curing the curable resin 40, namely the heating temperature of the curable resin 40, is preferably within the same range as the temperature range in the process (α).

The resin pressure at the time of filling the curable resin 40 is preferably from 2 to 30 MPa, particularly preferably from 3 to 10 MPa. When the resin pressure is at least the lower limit value in the above range, a drawback such as deficiency in filling the curable resin 40 is unlikely to occur. When the resin pressure is at most the upper limit value in the above range, it is easy to obtain a semiconductor package 1 of excellent quality. The resin pressure of the curable resin 40, can be adjusted by the plunger 64.

Figure 10:
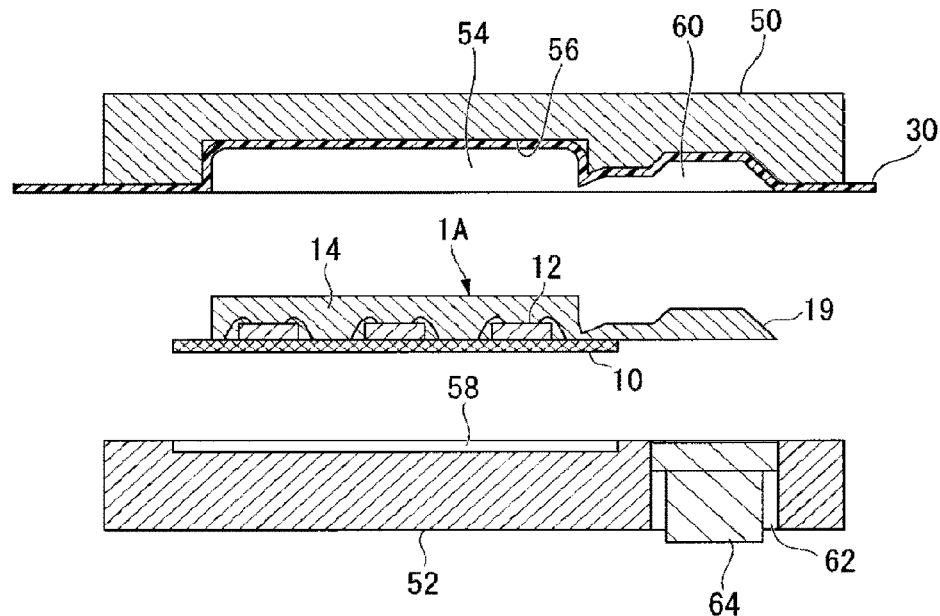
FIG. 10 is a cross-sectional view showing the step (β5) in the second embodiment of the process for producing a semiconductor package of the present invention.

Step (β5):

As shown in FIG. 10, the collectively encapsulated product 1A is taken out from the mold. At that time, the cured product 19 of the curable resin 40 cured in the resin introducing portion 60 is taken out from the mold along with the collectively encapsulated product 1A in such a state as attached to the encapsulation portion 14 of the collectively encapsulated product 1A. Therefore, by cutting away the cured product 19 attached to the collectively encapsulated product 1A, the collectively encapsulated product 1A is obtained.

Step (β6):

The substrate 10 and the resin-encapsulation portion 14 of the collectively encapsulated product 1A obtained in step (β5) are cut (singulated) so that semiconductor chips 12 are separated, to obtain singulated encapsulated products each comprising a substrate 10, at least one semiconductor chip 12 and a resin-encapsulation portion for encapsulating the semiconductor chip 12.

The step (β6) may be carried out in the same manner as the step (α6).

Step (β7):

On the upper surface 14a (the surface which was in contact with the first surface of the mold release film 30) of the resin-encapsulation portion 14 of the obtained singulated encapsulated product, in order to display an optional information, an ink is applied to form an ink layer 16 to obtain a semiconductor package 1.

The step (β7) may be carried out in the same manner as the step (α7).

Here, in this embodiment, a case was shown wherein after the step (β5), the steps (β6) and (β7) are carried out in this order, but the steps (β6) and (β7) may be carried out in the reverse order. That is, an ink layer may be formed by using an ink on the surface of the resin-encapsulation portion of the collectively encapsulated product taken out from the mold, which was in contact with the mold release film, and then, the substrate and the resin-encapsulation portion of the collectively encapsulated product may be cut.

In the foregoing, the process for producing a semiconductor package of the present invention has been described with reference to the first and second embodiments, but the present invention is by no means limited to the above embodiments. The respective constructions and their combinations in the above embodiments are only examples, and within a range not departing from the gist of the present invention, additions, omissions, substitutions and other modifications of the constructions are possible.

For example, the semiconductor package to be produced is not limited to a semiconductor package 1. For example, the semiconductor chips or other components may be exposed from the encapsulation portion and may be in contact directly with the mold release film. Or, the encapsulation portion may not be flat, and may be stepped.

The timing of peeling off the resin-encapsulation portion from the mold release film, is not limited to at the time of taking out the resin-encapsulation portion from the mold, but the resin-encapsulation portion may be taken out together with the mold release film from the mold and then, the mold release film may be peeled off from the resin-encapsulation portion.

The distances between the plurality of semiconductor chips 12 to be collectively encapsulated may be uniform or may not be uniform. It is preferred to equalize the distances between the plurality of semiconductor chips 12, since encapsulation can thereby be made uniformly, and a load may be applied uniformly on the plurality of semiconductor chips 12, respectively (i.e. the load may be minimized).

Further, the semiconductor package to be produced by the process for producing a semiconductor package of the present invention is not limited to the semiconductor package 1. For example, the semiconductor chips or other components may be exposed from the encapsulation portion and may be in contact directly with the mold release film. Or, the encapsulation portion may not be flat, and may be stepped.

Depending upon the semiconductor package to be produced, the steps (α6) and (α7) in the first embodiment, or the steps (β6) and (β7) in the second embodiment, may not be conducted.

For example, the shape of the resin-encapsulation portion is not limited to the substantially rectangular cross-section as shown in FIG. 1. The number of semiconductors to be encapsulated in the resin-encapsulation portion may be one or plural. The ink layer is not essential.

In a case where a light emitting diode is produced as the semiconductor package, since the resin-encapsulation portion functions also as a lens portion, usually, no ink layer is formed on the surface of the resin-encapsulation portion. When it is a lens portion, as the shape of the resin-encapsulation portion, various lenses shapes may be employed, such as substantially hemispherical, bullet-shaped, Fresnel lens type, semi-cylindrical, substantially hemispherical lens array type, etc.

EXAMPLES

Hereinafter, the present invention will be described in detail with reference to Examples. However, the present invention is not limited by the following description.

Among the following Ex. 1 to 29, Ex. 1 to 9 and 18 to 23 are Examples of the present invention, and Ex. 10 to 15, 17 and 24 to 29 are Comparative Examples. Ex. 16 is a Reference Example.

The materials and evaluation methods used in Examples are shown below.

[Materials Used]

ETFE (1): ETFE (MFR: 12.0 g/10 min., melting point: 262° C.) obtained in Production Example 1 given below, wherein tetrafluoroethylene/ethylene/PFBE=52.7/45.9/1.4 (molar ratio).

ETFE (2): ETFE (MFR: 10.1 g/10 min., melting point: 268° C.) obtained in Production Example 2 given below, wherein tetrafluoroethylene/ethylene/PFBE=52.7/46.5/0.8 (molar ratio).

ETFE (3): ETFE (MFR: 5.4 g/10 min., melting point: 261° C.) obtained in Production Example 3 given below, wherein tetrafluoroethylene/ethylene/PFBE=52.7/45.8/1.5 (molar ratio).

Here, MFR of each of ETFE (1) to (3) is a value measured under a load of 49N at a measuring temperature of 297° C. in accordance with ASTM D3159.

<Production Example 1

Production of ETFE (1)

A polymerization tank having an internal capacity of 1.3 L and equipped with a stirrer, was deaerated; 881.9 g of 1-hydrotridecafluoro-hexane, 335.5 g of 1,3-dichloro-1,1,2,2,3-pentafluoropropane (trade name "AK225cb" manufactured by Asahi Glass Company, Ltd., hereinafter referred to as AK225cb) and 7.0 g of $CH_2$=$CHCF_2CF_2CF_3$ (PFBE), were charged; 165.2 g of TFE and 9.8 g of ethylene (hereinafter referred to as E) were injected; the temperature in the polymerization tank was raised to 66° C.; and as a polymerization initiator solution, 7.7 mL of an AK225cb solution containing 1 mass % of tert-butyl peroxypivalate (hereinafter referred to as PBPV) was charged to initiate the polymerization.

A monomer mixture gas of TFE/E=54/46 by molar ratio was continuously charged so that the pressure would be constant during the polymerization. Further, along with the charging of the monomer mixture gas, PFBE was continuously charged in an amount corresponding 1.4 mol % to the total number of moles of TFE and E. After 2.9 hours from the initiation of the polymerization, at the time when 100 g of the monomer mixture gas was charged, the inside temperature of the polymerization tank was lowered to room temperature, and at the same time, the pressure of the polymerization tank was purged to normal pressure.

Thereafter, the slurry was suction filtered through a glass filter, and a solid content was recovered and dried at 150° C. for 15 hours to obtain 107 g of ETFE (1).

Production Example 2

Production of ETFE (2)

105 g of ETFE (2) was obtained in the same manner as in Production Example 1 except that the amount of PFBE charged prior to initiating polymerization was changed from 7.0 g to 3.9 g, the amount of the AK225cb solution containing 1 mass % of PBPV was changed from 7.7 mL to 5.8 mL, and the amount of PFBE continuously charged during the polymerization was changed from 1.4 mol % to 0.8 mol % to the total number of moles of TFE and E.

Production Example 3

Production of ETFE (3)

102 g of ETFE (3) was obtained in the same manner as in Production Example 1 except that the amount of 1-hydrotridecafluoro-hexane charged prior to initiating polymerization was changed from 881.9 g to 954.9 g, the amount of AK225cb was changed from 335.5 g to 267.8 g, the amount of PFBE was changed from 7.0 g to 7.1 g, the amount of TFE was changed from 165.2 g to 158.5 g, the amount of E was changed from 9.8 g to 9.4 g, and the amount of PFBE continuously charged during the polymerization (relative to the total number of moles of TFE and E) was changed from 1.4 mol % to 1.5 mol %.

<Pressing Roll>

As the pressing roll, a die roll was used.

In all cases, a silica-containing silicone rubber wound roll having a Shore D hardness of 50 was used.

The compositions, Ra and RPc of die rolls 1 to 8 are shown in Table 1.

TABLE 1

| | Die roll 1 | Die roll 2 | Die roll 3 | Die roll 4 | Die roll 5 | Die roll 6 | Die roll 7 | Die roll 8 |
|---|---|---|---|---|---|---|---|---|
| Average particle size of silica (μm) | 30 | 30 | 24 | 52 | 60 | 3 | 30 | 30 |
| Silicone rubber (parts by weight) | 85 | 70 | 85 | 90 | 85 | 85 | 55 | 95 |
| Silica (parts by weight) | 15 | 30 | 15 | 10 | 15 | 15 | 45 | 5 |
| Ra (μm) | 2.2 | 2.2 | 1.7 | 3.2 | 3.6 | 0.13 | 2.2 | 2.2 |
| RPc | 110 | 220 | 110 | 88 | 110 | 110 | 330 | 55 |

<Cooling Roll>

Any one of die rolls 1 to 8, or a metal mirror surface roll (material: SUS304, Ra: 0.25, RPc: 55) was used.

Ex. 1

ETFE (1) was melt-extruded by an extruder having a lip adjusted to bring the thickness to be 50 μm, by adjusting the temperature so that the resin temperature immediately before being taken up by rolls after extruded by a die would be 300° C., and taken up between a die roll and a cooling roll. By adjusting parameters as shown below, a mold release film (ETFE film) was obtained so that one side would be Ra: 1.7 μm and RPc: 100. Of the surface formed by the cooling roll, Ra was 0.2 μm, and RPc was 50.

Production Conditions
  Rolls: die roll 1/metallic mirror surface roll
  Pressure exerted between rolls: 50 N/cm
  Melt viscosity at 300° C.: 1,000 Pa·s
  Melt viscosity at 300° C./pressure exerted between rolls: 20

Ex. 2 to 29

Mold release films (ETFE films) were obtained in the same manner as in Ex. 1 except that as ETFE, ones shown in Tables 2 to 5 were used, and the die roll, the film-forming speed and the pressing pressure between rolls were adjusted so that the thickness, and Ra and RPc on one surface, would be the values as shown in Tables 2 to 5. Here, the surface with Ra being 0.2 μm and RPc being 50 is a surface formed by a cooling roll.

[Evaluation Methods]

(MFR)

Measured under a load of 49N at 297° C. in accordance with ASTM D3159.

(Melting Point)

Obtained from the endothermic peak at the time when ETFE was heated in an air atmosphere to 300° C. at a rate of 10° C./min by means of a scanning differential thermal analyzer (manufactured by SII Nanotechnologies, Inc., DSC220CU).

(Resin Temperature)

A resin temperature sensor GRMT (manufactured by DYNISCO) was installed at a position immediately before being taken up by the two rolls after extruded from a die, and the temperature of the molten resin was directly measured in contact with the thermometer.

(Melt Viscosity)

Measured by using Capillograph 1D (manufactured by Toyo Seiki Co. Ltd.). The measurement temperature was set to be the resin temperature measured by the above method, the furnace body diameter was 9.55 mm, and, as the capillary, one having an inner diameter of 1 mm and a length of 10 mm, was used. The piston speed was adjusted so that the Shear rate would be 10/sec. and the apparent viscosity at that time was obtained.

(Measurement of Thickness of Film)

Measured in accordance with ISO4591: 1992 (JIS K7130: 1999 B1 Method).

(Measurement of Tensile Modulus of Elasticity Of Film)

The tensile modulus of elasticity at 180° C. was measured by a method in accordance with JIS K7127: 1999 (ISO 527-3 1995).

(Ra)

Ra was measured in accordance with JIS B0601: 2013 (ISO4287: 1997, Amd. 1: 2009). The standard length (cut-off value λc) was set to be 0.8 mm. In the measurement, using SURFCOM 480A (manufactured by Tokyo Seimitsu Co., Ltd.), Ra was obtained at a total of six points i.e. at three points in the direction perpendicular to the flow direction during the production of a film and at three points in the direction parallel thereto, and their average value was taken as Ra of the surface.

(RPc)

RPc was measured in accordance with JIS B0601: 2013 (ISO4287: 1997, Amd. 1: 2009). The standard length was set to be 10 mm. In the measurement, using SURFCOM 480A (manufactured by Tokyo Seimitsu Co., Ltd.), RPc was obtained at a total of six points i.e. at three points in the direction perpendicular to the flow direction of a film and at three points in the direction parallel thereto, and their average value was taken as RPc of the surface.

(Evaluation of Unlikeliness of Formation of Pinholes)

Figure 11:
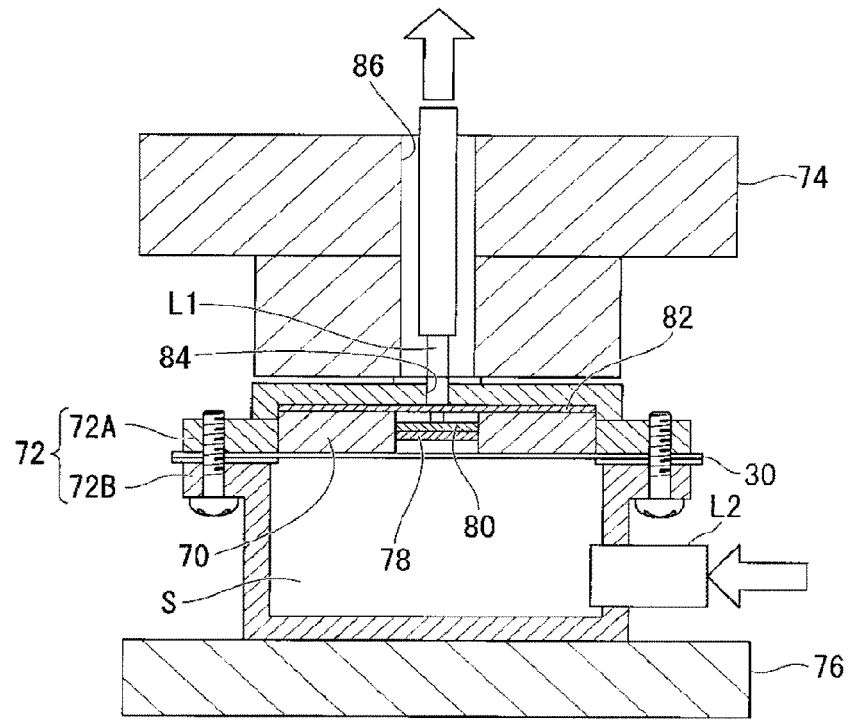
FIG. 11 is a view illustrating a method for evaluating unlikeliness of formation of pinholes in Examples.

This evaluation method will be described with reference to FIG. 11.

The apparatus used for this evaluation comprises a stainless steel frame member 70 (thickness: 3 mm) having a square hole of 11 mm×11 mm at its center, a jig 72 having a space S capable of accommodating the frame member 70 inside, a weight 74 disposed on the jig 72, and a hot plate 76 disposed below the jig 72.

Jig 72 comprises an upper member 72A and a lower member 72B. It is so designed that a mold release film 30 is sandwiched between the upper member 72A and the lower member 72B, and a weight 74 is placed, whereby the mold release film 30 is fixed, and at the same time, an airtight space S is formed. At that time, the frame member 70 is accommodated in the upper member 72A side of the jig 72 and is in contact with the mold release film 30, in such a state that a stainless steel frame (10.5 mm×10.5 mm) 78 and a stainless steel mesh (10.5 mm×10.5 mm) 80 are accommodated in a hole.

An exhaust port 84 is formed in the top surface of the upper member 72A, and a stainless steel mesh (10.5 mm×10.5 mm) 82 is disposed on the opening surface of the space S side of the exhaust ports 84. Further, at a position corresponding to the exhaust port 84, of the weight 74, a through hole 86 is formed, and a pipe L1 is connected to the exhaust port 84 through the through hole 86. The pipe L1 is connected to a vacuum pump (not shown), and it is so designed that the space S in the jig 72 can be depressurized by actuating the vacuum pump. The lower member 72B is connected to a pipe L2, and it is so designed that compressed air can be supplied to the space S in the jig 72 through the pipe L2.

In this apparatus, it is so designed that air between the mold release film 30 and the frame 78 can be suctioned by a vacuum pump by placing the mesh 80 in the hole of the frame member 70. Further, it is so designed that by changing the thickness of the frame 78 placed in the hole of the frame member 70, the follow-up depth can be changed. The follow-up depth represents a distance between the lower surface of the frame member 70 (the surface which contacts the mold release film 30) and the lower surface of the frame 78 (the surface on the mold release film 30 side).

In the evaluation, firstly, the mold release film 30 was fixed to the jig 72 by bringing it in close contact with the frame member 70. At that time, the mold release film 30 was disposed so that the second surface faced the upper side (the frame member side). Then, the entire jig 72 was heated to 180° C. by the hot plate 76, and then, the vacuum pump was operated to suction air between the frame 78 and the mold release film 30. Further, compressed air (0.5 MPa) was fed from the pipe L2 into the space S, to let the mold release film 30 follow to the frame member 70 and frame 78. That state was maintained for 3 minutes, and after checking the vacuum degree of the vacuum pump, the operation of the vacuum pump and the supply of compressed air were terminated, and the mold release film 30 was quickly taken out. With respect to the mold release film 30 taken out, the presence or absence of pinholes was visually confirmed.

The series of operations as described above was repeated while gradually stepwise deepening the follow-up depth at 0.1 mm intervals by changing the thickness of the frame 78, until pinholes are formed in the mold release film 30, and the maximum follow-up depth (mm) at which the pinholes were not formed, was obtained. The deeper the maximum follow-up depth, the more unlikely, the formation of pinholes.
(Evaluation of Unlikeliness of Formation of Wrinkles)

Figure 12:
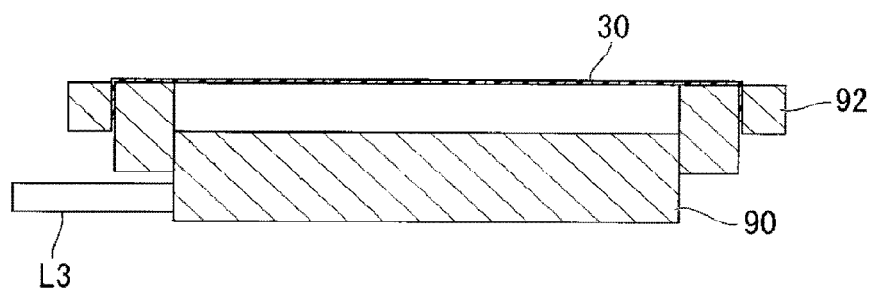
FIG. 12 is a view illustrating a method for evaluating unlikeliness of formation of wrinkles in Examples.
Figure 12:
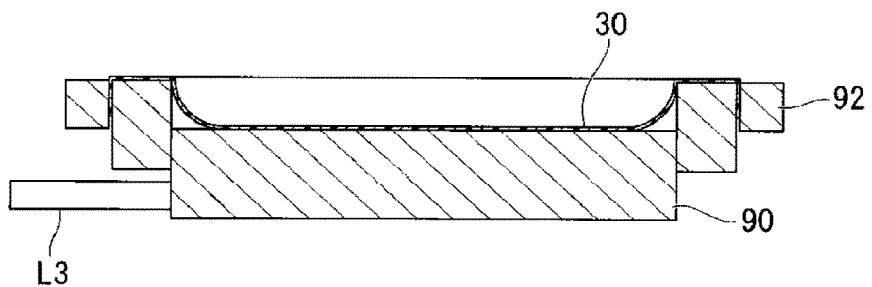
Figure 12:
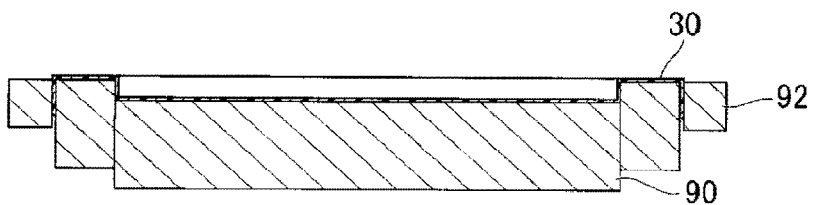

This evaluation method will be described with reference to FIG. 12.

A mold used in this evaluation comprises a stationary lower die (20 mm×20 mm) 90 made of a metal, and a frame-shaped movable horizontal die 92 made of a metal disposed at the periphery of the stationary lower die 90. This mold is designed so that by moving the movable horizontal die 92 up and down, the level difference between the stationary lower die 90 and the movable horizontal die 92 can be changed. Here, the level distance represents a distance between the upper surface of the stationary lower die 90 and the upper surface of the movable horizontal die 92.

The movable horizontal die 92 is designed to pinch and fix the mold release film 30.

In the stationary lower die 90, an exhaust port (not shown) is formed, and to the exhaust port, a pipe L3 is connected. This pipe L3 is connected to a vacuum pump (not shown), and it is so designed that by operating the vacuum pump, air between the mold release film 30 and the stationary lower die 90 can be suctioned so as to let the mold release film 30 be adsorbed to the stationary lower die 90. The upper surface of the stationary lower die 90 (the surface to be in contact with the mold release film 30) is mirror-finished (#800).

In the evaluation, firstly, as shown in FIG. 12(a), a mold release film 30 was disposed on the movable horizontal die 92, and fixed. At that time, the mold release film 30 was disposed so that the second surface faced the lower side (the stationary lower die 90 direction). The level difference between the stationary lower die 90 and the movable horizontal die 92 at that time, was set to be 1 mm.

Then, the entire mold including the stationary lower mold 90, was disposed on a hot plate (not shown) and heated to 180° C. In this state, as shown in FIG. 12(b), by operating the vacuum pump, air between the upper surface of the stationary lower die 90 and the mold release film 30 was suctioned via the pipe L3, and the mold release film 30 was vacuum-suctioned and adsorbed on the upper surface of the stationary lower die 90.

In a state of continued heating at 180° C., as shown in FIG. 12(c), the movable horizontal die 92 was lowered, and the level difference between the stationary lower die 90 and the movable horizontal die 92 was made to be 0.3 mm (the mold release film 30 became ample). At that time, whether or not wrinkles or air spaces (voids) were formed in the mold release film 30 at the upper surface of the stationary lower die 90 was visually observed. From the results, unlikeliness of formation of wrinkles was evaluated by the following evaluation standards.
<Evaluation Standards>

○ (Good): No wrinkles or air spaces are observed in the mold release film.

× (No good): Wrinkles or air spaces are observed in the mold release film.

With respect to the mold release films obtained in Ex. 1 to 17, the above evaluations were conducted by using a surface formed by the die roll as the second surface and a surface formed by the pressing roll as the first surface, and unlikeliness of formation of pinholes (the maximum follow-up depth) and unlikeliness of formation of wrinkles were evaluated. The results are shown in Tables 2 and 3.

TABLE 2

| | | | Ex. | | | | | | | | |
|---|---|---|---|---|---|---|---|---|---|---|---|
| | | | 1 | 2 | 3 | 4 | 5 | 6 | 7 | 8 | 9 |
| | ETFE used | | (1) | (1) | (1) | (1) | (2) | (3) | (1) | (1) | (1) |
| | Thickness (μm) | | 50 | 50 | 50 | 50 | 50 | 50 | 40 | 50 | 50 |
| | Tensile modulus of elasticity at 180° C. (MPa) | | 30 | 30 | 30 | 30 | 60 | 30 | 30 | 30 | 30 |
| Production conditions | Pressing roll (second surface) | | Die roll 1 | Die roll 2 | Die roll 3 | Die roll 4 | Die roll 1 | Die roll 1 | Die roll 1 | Die roll 1 | Die roll 1 |
| | Cooling roll (first surface) | | Metal mirror-surface roll | | | | | | | Die roll 1 | Metal mirror-surface roll |
| | Pressing pressure between rolls (N/cm) | | 50 | 50 | 50 | 50 | 75 | 100 | 50 | 50 | 20 |
| | Resin temperature (° C.) | | 300 | 300 | 300 | 300 | 300 | 300 | 300 | 300 | 300 |
| | Melt viscosity (Pa·s) | | 1,000 | 1,000 | 1,000 | 1,000 | 1,500 | 2,000 | 1,000 | 1,000 | 1,000 |
| | Melt viscosity/linear pressure | | 20 | 20 | 20 | 20 | 20 | 20 | 20 | 20 | 50 |
| Film | Second surface | Ra (μm) | 1.7 | 1.7 | 1.3 | 2.5 | 1.7 | 1.7 | 1.7 | 1.7 | 1.3 |
| | | RPc | 100 | 200 | 100 | 80 | 100 | 100 | 100 | 100 | 100 |
| | First surface | Ra (μm) | 0.2 | 0.2 | 0.2 | 0.2 | 0.2 | 0.2 | 0.2 | 1.7 | 0.15 |
| | | RPc | 50 | 50 | 50 | 50 | 50 | 50 | 50 | 100 | 50 |
| Maximum follow-up depth (mm) | | | 0.7 | 0.6 | 0.7 | 0.6 | 0.7 | 0.6 | 0.6 | 0.7 | 0.7 |
| Unlikeliness of formation of wrinkles | | | ○ | ○ | ○ | ○ | ○ | ○ | ○ | ○ | ○ |

TABLE 3

| | | EX. | | | | | | | |
|---|---|---|---|---|---|---|---|---|---|
| | | 10 | 11 | 12 | 13 | 14 | 15 | 16 | 17 |
| ETFE used | | (1) | (1) | (1) | (1) | (2) | (3) | (1) | (1) |
| Thickness (μm) | | 50 | 50 | 50 | 50 | 50 | 50 | 25 | 50 |
| Tensile modulus of elasticity at 180° C. (MPa) | | 30 | 30 | 30 | 30 | 60 | 30 | 30 | 30 |

TABLE 3-continued

| | | EX. | | | | | | | |
|---|---|---|---|---|---|---|---|---|---|
| | | 10 | 11 | 12 | 13 | 14 | 15 | 16 | 17 |
| Production conditions | Pressing roll (second surface) | Die roll 5 | Die roll 6 | Die roll 7 | Die roll 8 | Die roll 7 | Die roll 7 | Die roll 1 | Die roll 1 |
| | Cooling roll (first surface) | Metal mirror-surface roll | | | | | | | |
| | Pressing pressure between rolls (N/cm) | 50 | 50 | 50 | 50 | 75 | 100 | 50 | 15 |
| | Resin temperature (° C.) | 300 | 300 | 300 | 300 | 300 | 300 | 300 | 300 |
| | Melt viscosity (Pa · s) | 1,000 | 1,000 | 1,000 | 1,000 | 1,500 | 2,000 | 1,000 | 1,000 |
| | Melt viscosity/linear pressure | 20 | 20 | 20 | 20 | 20 | 20 | 20 | 67 |
| Film | Second surface Ra (μm) | 2.8 | 0.1 | 1.7 | 1.7 | 1.7 | 1.7 | 1.7 | 0.5 |
| | RPc | 100 | 100 | 300 | 50 | 300 | 300 | 100 | 100 |
| | First surface Ra (μm) | 0.2 | 0.2 | 0.2 | 0.2 | 0.2 | 0.2 | 0.2 | 0.2 |
| | RPc | 50 | 50 | 50 | 50 | 50 | 50 | 50 | 50 |
| Maximum follow-up depth (mm) | | 0.4 | 0.9 | 0.4 | 0.8 | 0.4 | 0.4 | 0.4 | 0.9 |
| Unlikeliness of formation of wrinkles | | ○ | X | ○ | X | ○ | ○ | X | X |

As shown in the above results, the mold release films in Ex. 1 to 9 wherein the thickness was from 40 to 75 μm, Ra of the second surface was from 1.3 to 2.5 μm, and RPc was 80 to 200, were ones wherein the maximum follow-up depth was at least 0.6 mm and pinholes were unlikely to be formed during following-up to the mold. Further, these mold release films were ones in which wrinkles were unlikely to be formed during following-up to the mold.

On the other hand, the mold release film in Ex. 10 wherein Ra exceeded 2.5 μm and the mold release films in Ex. 12, 14 and 15, wherein RPc of the second surface exceeded 200, were ones wherein pinholes were likely to be formed during following-up to the mold.

The mold release films in Ex. 11 and 17 wherein Ra was less than 1.3 μm, and the mold release film in Ex. 13 wherein RPc was less than 80, were ones wherein wrinkles were likely to be formed at the time of following-up to the mold. Further, in the case of the mold release film having irregularities on the second surface, if the film was thin, wrinkles were likely to be formed during following-up to the mold (Ex. 16).

(Preparation of Evaluation Sample)

On a square-shaped metal plate of 15 cm×15 cm (thickness: 3 mm), a square shaped polyimide film (trade name: Upilex 125S, manufactured by Ube Industries, Ltd., thickness: 125 μm) of a size of 15 cm×15 cm was put. Further, on the polyimide, as a spacer, a polyimide film (thickness 3 mm) of a square shape of 15 cm×15 cm having a rectangular hole of 10 cm×8 cm formed at its center, was put. In the vicinity of the center of the hole, 2 g of an epoxy granular resin (trade name: SUMIKON EME G770H type F ver GR, manufactured by Sumitomo Bakelite Co., Ltd., mold shrinkage rate of 1.0%) for encapsulation of a semiconductor, was put. Further thereon, a mold release film of a square shape of 15 cm×15 cm was put so that the first surface faced the lower side (the epoxy resin side), and finally thereon, a metal plate of a square shape of 15 cm×15 cm (thickness: 3 mm) was placed, to obtain a laminated sample.

The laminated sample was put in the press machine (50t press machine, press area: 45 cm×50 cm) heated at 180° C. and pressed under a pressure of 100 kg/cm² for 5 minutes.

After the pressing, the spacer, the mold release film and the metal plate on the mold release film side were removed. Thereby, an evaluation sample having the metal plate and the epoxy resin plate laminated, was obtained.

(Evaluation of Ink Adhesion)

Ultraviolet (UV) curable ink (product number: 4466, manufactured by Markem-Imaje Co., Ltd.) was diluted to 3 times with ethyl acetate. The diluted ink was applied to the epoxy resin surface of the evaluation sample (the surface which was in contact with the first surface of the mold release film during the production of the evaluation sample) by using a bar coater #3. The coating amount was 1 g/m². After the coating, the evaluation sample was put in a hot air oven at 100° C. and dried for 3 minutes.

The evaluation sample having the aforementioned ink applied and dried, was irradiated with UV under a condition of 3 kW for 10 seconds in a UV irradiation device, to cure the ink thereby to form an ink layer.

The adhesion to the epoxy resin surface, of the formed ink layer, was evaluated in accordance with ISO2409 (JIS K5600-5-6-2009). From the results, the ink adhesion was evaluated by the following standards. ⊚ and ○ are evaluation standards for practically acceptable levels.

⊚ (excellent): No peeling is observed in any eye of the grid.

○ (good): Peeling is observed in part of the grid.

Δ (poor): Peeling is observed in more than 50% of the grid.

× (no good): Peeling is observed on the entire surface.

(Evaluation of Chipping or Cracking During Singulation)

From the evaluation sample, the metal plate was removed, and the remaining epoxy resin plate was cut by a dicing blade (a diamond cutter having a diameter of φ5 cm and a thickness of 0.1 mm), whereupon the cross-section was washed with water. Then, the cross section was observed by an optical microscope (magnification: 100 times), and unlikeliness of chipping or cracking during singulation was evaluated by the following standards.

○ (good): No chipping or cracking is observed in the cross section.

× (no good): Chipping or cracking is observed in the cross section.

Using the same mold release films as the mold release films used in Ex. 1 to 6, the above-described evaluation samples were prepared by using a surface formed by the die roll as the first surface and a surface formed by the pressing roll as the second surface, whereupon the ink adhesion, and chipping or cracking during singulation, were evaluated (Ex. 18 to 23). The results are shown in Table 4.

TABLE 4

| | Ex. | | | | | |
|---|---|---|---|---|---|---|
| | 18 | 19 | 20 | 21 | 22 | 23 |
| ETFE used | (1) | (1) | (1) | (1) | (2) | (3) |
| Tensile modulus of elasticity at 180° C. (MPa) | 30 | 30 | 30 | 30 | 60 | 30 |
| First surface Ra (μm) | 1.7 | 1.7 | 1.3 | 2.5 | 1.7 | 1.7 |
| RPc | 100 | 200 | 100 | 80 | 100 | 100 |
| Second surface Ra (μm) | 0.2 | 0.2 | 0.2 | 0.2 | 0.2 | 0.2 |
| RPc | 50 | 50 | 50 | 50 | 50 | 50 |
| Ink adhesion | ○ | ○ | ○ | ○ | ○ | ○ |
| Chipping or cracking during singulation | ○ | ○ | ○ | ○ | ○ | ○ |

Using the mold release films (in Ex. 10, 12, 14 and 15) wherein the evaluation of unlikeliness of formation of wrinkles was ○ (good), among the mold release films used in Ex. 10 to 16, the above-described evaluation samples were prepared by using a surface formed by the die roll as the first surface and a surface formed by the pressing roll as the second surface, whereupon the ink adhesion, and chipping or cracking during singulation, were evaluated (Ex. 24, 26, 28 and 29). Further, using mold release films other than these, the above-described evaluation samples were prepared in the same manner, whereupon the ink adhesion, and chipping or cracking during singulation, were evaluated (Ex. 25 and 27). These results are shown in Table 5.

TABLE 5

| | Ex. | | | | | |
|---|---|---|---|---|---|---|
| | 24 | 25 | 26 | 27 | 28 | 29 |
| ETFE used | (1) | (1) | (1) | (1) | (2) | (3) |
| Tensile modulus of elasticity at 180° C. (MPa) | 30 | 30 | 30 | 30 | 60 | 30 |
| First surface Ra (μm) | 2.8 | 0.5 | 1.7 | 1.7 | 1.7 | 1.7 |
| RPc | 100 | 100 | 300 | 60 | 300 | 300 |
| Second surface Ra (μm) | 0.2 | 0.2 | 0.2 | 0.2 | 0.2 | 0.2 |
| RPc | 50 | 50 | 50 | 50 | 50 | 50 |
| Ink adhesion | ◎ | X | ◎ | X | ◎ | ◎ |
| Chipping or cracking during singulation | X | ○ | X | ○ | X | X |

As shown in the above results, epoxy resin plates formed by using the mold release films in Ex. 18 to 23 wherein Ra of the first surface was from 1.3 to 2.5 μm and RPc was from 80 to 200, were excellent in ink adhesion and were unlikely to undergo chipping or cracking during singulation.

On the other hand, an epoxy resin plate which was formed by using the mold release film of Ex. 24 wherein Ra exceeded 2.5 μm, was likely to undergo chipping or cracking during singulation.

An epoxy resin plate which was formed by using the mold release film of Ex. 25 wherein Ra was less than 1.3 μm, was inadequate in ink adhesion.

Epoxy resin plates which were formed by using mold release films in Ex. 26, 28 and 29 wherein RPc exceeded 200, were likely to undergo chipping or cracking during singulation.

An epoxy resin plate which was formed by using the mold release film in Ex. 27 wherein RPc was less than 80, was inadequate in ink adhesion.

INDUSTRIAL APPLICABILITY

The mold release film of the present invention is excellent in releasability when a semiconductor element is encapsulated with a curable resin and capable of preventing the resin-encapsulation portion from becoming poor appearance by the mold release film or preventing the curable resin from adhesion to the mold, and it is also capable of forming a resin-encapsulation portion having excellent adhesion to an ink layer. By using the mold release film of the present invention, it is possible to produce a semiconductor package such as an integrated circuit having integrated a semiconductor element such as a transistor, a diode or the like.

This application is a continuation of PCT Application No. PCT/JP20114/079592, filed on Nov. 7, 2014, which is based upon and claims the benefit of priority from Japanese Patent Application No. 2013-231366 filed on Nov. 7, 2013 and Japanese Patent Application No. 2013-231367 filed on Nov. 7, 2013. The contents of those applications are incorporated herein by reference in their entireties.

REFERENCE SYMBOLS

1: semiconductor package, 10: substrate, 12: semiconductor chip (semiconductor element), 14: resin-encapsulation portion, 14a: upper surface of the resin-encapsulation portion 14, 16: ink layer, 18: bonding wire, 19: cured product, 20: stationary upper mold, 22: cavity bottom member, 24: movable lower mold, 26: cavity, 30: mold release film, 40: curable resin, 50: upper mold, 52: lower mold, 54: cavity, 56: cavity surface, 58: substrate placement portion, 60: resin introducing portion, 62: resin placement portion, 64: plunger, 70: frame member, 72: jig, 72A: upper member, 72B: lower member, 74: weight, 76: hot plate, 78: frame, 80: mesh, 82: mesh, 84: exhaust port, 86: through-hole, L1: piping, L2: piping, S: space, 90: stationary lower die made of metal, 92: frame shaped movable horizontal die made of metal

What is claimed is:

1. A mold release film to be disposed on a cavity surface of a mold in a method for producing a semiconductor package wherein a semiconductor element is disposed in the mold and encapsulated with a curable resin to form a resin-encapsulation portion, characterized in that
   it has a first surface to be in contact with the curable resin at the time of forming the resin-encapsulation portion, and a second surface to be in contact with the cavity surface,
   at least one of the first surface and the second surface has irregularities formed thereon, and the surface having irregularities formed thereon, has an arithmetic mean roughness (Ra) of from 1.3 to 2.5 μm and a peak count (RPc) of from 80 to 200.

2. The mold release film according to claim 1, wherein the thickness of the mold release film is from 16 to 75 μm.

3. The mold release film according to claim 1, wherein the second surface has irregularities formed thereon, and the thickness of the mold release film is from 40 to 75 μm.

4. The mold release film according to claim 1, wherein the arithmetic mean roughness (Ra) is from 1.6 to 1.9 μm.

5. The mold release film according to claim 1, wherein the peak count (RPc) is from 100 to 130.

6. The mold release film according to claim 1, which is made of a fluororesin.

7. The mold release film according to claim 6, wherein the fluororesin is an ethylene/tetrafluoroethylene copolymer.

8. The mold release film according to claim 7, wherein the ethylene/tetrafluoroethylene copolymer comprises units based on tetrafluoroethylene, units based on ethylene, and units based on a third monomer other than tetrafluoroethylene and ethylene, and the molar ratio (TFE/E) of the units based on tetrafluoroethylene to the units based on ethylene in the ethylene/tetrafluoroethylene copolymer is from 80/20 to 40/60.

9. The mold release film according to claim 8, wherein the proportion of the units based on the third monomer is from 0.01 to 20 mol % to the total of all units in the ethylene/tetrafluoroethylene copolymer.

10. The mold release film according to claim 9, wherein the third monomer is (perfluorobutyl)ethylene, and the proportion of units based on the (perfluorobutyl)ethylene is from 0.5 to 4.0 mol % to the total of all units in the ethylene/tetrafluoroethylene copolymer.

11. The mold release film according to claim 7, wherein MFR as measured in accordance with ASTM D3159, of the ethylene/tetrafluoroethylene copolymer, is from 2 to 40 g/10 min.

12. A process for producing a semiconductor package formed of a semiconductor element and a curable resin and having a resin-encapsulation portion for encapsulating the semiconductor element, which comprises a step of disposing the mold release film as defined in claim 1 and having the irregularities formed at least on the second surface, on a cavity surface of a mold to be in contact with the curable resin, so that the first surface faces the space in the cavity, a step of disposing a substrate having a semiconductor element mounted thereon, in the cavity, encapsulating the semiconductor element with the curable resin, and curing the curable resin in such a state that it is in contact with the mold release film, to form a resin-encapsulation portion, thereby to obtain an encapsulated product comprising the substrate, the semiconductor element mounted on the substrate and the resin-encapsulation portion for encapsulating the semiconductor element, and a step of releasing the encapsulated product from the mold.

13. A process for producing a semiconductor package formed of a semiconductor element and a curable resin and having a resin-encapsulation portion for encapsulating the semiconductor element, and an ink layer formed on the surface of the resin-encapsulation portion, which comprises a step of disposing the mold release film as defined in claim 1 and having the irregularities at least on the first surface, on a cavity surface of a mold to be in contact with the curable resin, so that the first surface faces the space in the cavity, a step of disposing a substrate having a plurality of semiconductor elements mounted thereon, in the cavity, encapsulating the plurality of semiconductor elements collectively with the curable resin, and curing the curable resin in such a state that it is in contact with the mold release film, to form a resin-encapsulation portion, thereby to obtain a collectively encapsulated product comprising the substrate, the plurality of semiconductor elements mounted on the substrate and the resin-encapsulation portion for collectively encapsulating the plurality of semiconductor elements, a step of cutting the substrate and the resin-encapsulation portion of the collectively encapsulated product so that the plurality of semiconductor elements are separated, to obtain singulated encapsulated products each having a substrate, at least one semiconductor element mounted on the substrate, and a resin-encapsulation portion for encapsulating the semiconductor element, and a step of forming an ink layer by using an ink, on the surface which was in contact with the mold release film, of the resin-encapsulation portion of the collectively encapsulated product or the singulated encapsulated product.

* * * * *